(12) United States Patent
Nishioka et al.

(10) Patent No.: US 8,821,761 B2
(45) Date of Patent: Sep. 2, 2014

(54) ANTISTATIC AGENT, ANTISTATIC FILM AND ARTICLES COATED WITH ANTISTATIC FILM

(75) Inventors: Ayako Nishioka, Chiba (JP); Takashi Ohkubo, Chiba (JP)

(73) Assignee: Showa Denko K.K., Tokyo (JP)

( * ) Notice: Subject to any disclaimer, the term of this patent is extended or adjusted under 35 U.S.C. 154(b) by 708 days.

(21) Appl. No.: 11/657,550

(22) Filed: Jan. 25, 2007

(65) Prior Publication Data
US 2007/0181857 A1 Aug. 9, 2007

(30) Foreign Application Priority Data

Feb. 8, 2006 (JP) .................. 2006-031587
Feb. 15, 2006 (JP) .................. 2006-038436
Sep. 13, 2006 (JP) .................. 2006-248758

(51) Int. Cl.
*H01B 1/00* (2006.01)
*C09D 5/24* (2006.01)
*G03F 7/09* (2006.01)
*C09K 3/16* (2006.01)
*C08L 65/00* (2006.01)

(52) U.S. Cl.
CPC ... *C09K 3/16* (2013.01); *C09D 5/24* (2013.01); *G03F 7/093* (2013.01); *C08L 65/00* (2013.01)
USPC ........................................ 252/500

(58) Field of Classification Search
USPC .............. 252/500, 8.81, 501.1; 430/201, 531, 430/532, 536, 533, 527, 631
See application file for complete search history.

(56) References Cited

U.S. PATENT DOCUMENTS

| | | | |
|---|---|---|---|
| 4,876,155 A * | 10/1989 | Thoese et al. | 428/480 |
| 5,262,224 A | 11/1993 | Ozaki et al. | |
| 5,560,870 A | 10/1996 | Watanabe et al. | |
| 6,013,427 A | 1/2000 | Eichorst et al. | |

FOREIGN PATENT DOCUMENTS

| | | | |
|---|---|---|---|
| EP | 1 088 856 A1 | 4/2001 | |
| EP | 1 306 722 A1 | 5/2003 | |
| EP | 1306722 | * 5/2003 | |
| EP | 1 324 124 A1 | 7/2003 | |
| EP | 1324124 | * 7/2003 | ............ B41M 5/44 |
| JP | 03069388 | * 3/1991 | |
| JP | 05-140541 | * 6/1993 | ............ C09K 3/16 |
| JP | 6-3813 A | 1/1994 | |
| JP | 7-48436 A | 2/1995 | |
| JP | 8-109351 A | 4/1996 | |
| JP | 08092279 A | 4/1996 | |
| JP | 08201979 A | 8/1996 | |
| JP | 09013011 A | 1/1997 | |
| JP | 9-198925 A | 7/1997 | |
| JP | 9-241514 A | 9/1997 | |
| JP | 10-195422 A | 7/1998 | |
| JP | 10306098 A | 11/1998 | |
| JP | 11-189746 A | 7/1999 | |
| JP | 2002-226721 | 8/2002 | |
| JP | 2002-226721 A | 8/2002 | |
| JP | 2002226721 | * 8/2002 | ............ C08L 101/12 |
| JP | 2003-29410 A | 1/2003 | |
| JP | 2003-140305 A | 5/2003 | |
| JP | 2003-261749 A | 9/2003 | |
| JP | 2004099678 A | 4/2004 | |
| JP | 2004-189784 A | 7/2004 | |
| JP | 2005-213340 A | 8/2005 | |
| JP | 2005-281704 A | 10/2005 | |
| JP | WO 2005113678 | * 12/2006 | ............ C08L 65/00 |
| KR | 0174282 B1 | 3/1999 | |
| WO | WO 2005/113678 A1 | 12/2005 | |

OTHER PUBLICATIONS

Database WPI, Section Ch, Week 200314, Derwent Publications Ltd., London, GB; AN 2003-142784, XP002427871 & JP 2002 226721 A (Mitsubishi Rayon Co Ltd), Aug. 14, 2002.

* cited by examiner

*Primary Examiner* — Monique Peets
(74) *Attorney, Agent, or Firm* — Sughrue Mion, PLLC

(57) ABSTRACT

An antistatic agent, a water-soluble electroconductive polymer, a solvent and a water-soluble polymer. In preferred embodiments, the water-soluble polymer has a polypeptide bond or a specific polyvinyl structure. Also disclosed is an antistatic film incorporating the antistatic agent, an article coated with an antistatic film and a pattern-forming method using the antistatic film.

12 Claims, No Drawings

ANTISTATIC AGENT, ANTISTATIC FILM AND ARTICLES COATED WITH ANTISTATIC FILM

TECHNICAL FIELD

The invention relates to an antistatic agent which can be used as a resist coating material (i.e. material for coating resist) in lithographic technology using light or electron beam or charged particle beam such as ion beam. More specifically, the invention relates to an antistatic agent which is capable of effectively preventing a film thinning phenomenon or fogging of a chemically amplified resist film when used as material for coating the resist film, an antistatic film using the antistatic agent and a product coated with the antistatic film.

BACKGROUND ART

A chemically amplified resist has been an essential material technically common in lithography using light or charged particle beam such as electron beam or ion beam. However, such a resist is susceptible to use environment and is known as a resist hard to handle.

In a case where a chemically amplified resist is coated with a water-soluble coating material, there is a problem that acid generated through exposure to light is neutralized by the coating material or that even without exposure to light, acid components contained in the coating material erode a surface layer of the resist, which generates the same state as in the case conducting exposure to light. Thus, even a trace amount of acid present in coating material considerably affects sensitivity of resist. This phenomenon comes out as film-thinning in case of a positive-type resist and as formation of a layer having low-solubility or insolubilized layer in case of a negative-type resist.

As methods for preventing these phenomenons, a method where pH decrease is controlled by using a buffer solution containing a weak acid and an amine (JP-A-H11-189746) as an aqueous solution of coating material, a method using a composition containing a fluorinated aliphatic sulfonic acid or a fluorinated aliphatic carboxylic acid (JP-A-2003-29410) and the like as an aqueous solution of coating material have been proposed.

Moreover, there is a problem that, since the surface is hydrophobic after film formation of a chemically amplified film, it is difficult to coat the surface with an antistatic agent, without imparting surface activity to the surface through addition of surfactant or the like. In an antistatic film, which is used to coat a resist, evenness and uniformity are required. For the purpose of improving coatability of antistatic agent, it has been conventionally proposed to allow the agent to contain surfactant or polymer serving as binder. For example, JP 06-3813 A reports on an electroconductive composition for pattern forming, comprising sulfonated polyaniline-containing composition which consists of a solvent-soluble polymer compound and/or surfactant as components. This document describes that uniformity, coatability, conductivity and the like can be enhanced by the technique. However, use of surfactant for imparting coatability adversely affects properties of resist by formation of a mixing layer or the like. In this regard, it has been proposed that by use a polymer compound having a nitrogen-containing functional group and a hydrophobic group at a terminal as antistatic agent for a chemically amplified resist, influence on chemically amplified resist can be reduced (JP-A-2002-226721). Moreover, JP-A-8-109351 teaches that a water-soluble polymer or a polymer compound forming emulsion in an aqueous system can be used as binder polymer in a composition having an effect of preventing charge-up.

An antistatic agent for resist is used for imparting temporary conductivity in the time of processing a resist and therefore, it is required that the agent not be insolubilized so that the agent may be easily removed with water or alkali water. Among water-soluble polymers, some of those having an ester group, which generate acid through hydrolysis and the like to thereby affect resist, are not suitable. Also, those having a crosslinkable terminal may be insolubilized during the processing and then cannot be removed. Further, water-soluble polymer having basicity, which causes precipitation when used in combination with a water-soluble electroconductive polymer having a sulfonic acid group, is not preferred.

Recent progress on semiconductor devices is remarkable. With improvement in precision of resist processing, demands for evenness and uniformity in antistatic agent film and for higher resolution of resist are more and more increasing. In conventional techniques, coatability of antistatic agent is insufficient and furthermore, influence on resist shape caused by additives such as surfactant contained in conventional antistatic agents determines quality of semiconductor products. That is, in microfabrication process of resist of 100 nm or less, resist shape is controlled on the order of several nm. In such a microfabrication process, even a slight influence on resist caused by antistatic agent may significantly impair rectangleness of resist. Further, resist having been patterned through developing process is subsequently subjected to dry etching for pattern transcription onto the substrate. For the purpose of preventing collapse of resist patterned according to miniaturization of the minimum circuit line width in semiconductor devices, resist films are being more and more thinned so that an aspect ratio may be appropriate for resist pattern. Changes in resist shape have a great influence on pattern transcription at the time of dry etching process. In other words, with advance on technology for producing semiconductor devices, there are increased demands for antistatic agent which can maintain performance of chemically amplified resist and antistatic agent which can further reduce influence on resist is desired. Furthermore, in case of non-chemically-amplified resist, inorganic resist is sometimes employed in ultra-microfabrication process on the order of 10 nm, which may cause film thinning.

DISCLOSURE OF INVENTION

The object of the invention is to provide an antistatic agent exhibiting an excellent property of preventing film-thinning phenomenon and fogging in chemically amplified resists, an antistatic film using the antistatic agent and a product coated therewith.

As a result of intensive studies with a view to solving the above problems, the present inventors have found out that by using a water-soluble polymer, especially a water-soluble polymer compound having a polypeptide bond or a specific water-soluble polymer compound having a polyvinyl structure in combination with a water-soluble electroconductive polymer in an antistatic agent, influences on resist (such as fogging, film-thinning phenomenons and dissolution of resist after developing of resist) can be suppressed even when surfactant is added into the antistatic agent for the purpose of imparting coatability inexpensively and easily, while maintaining coatability of the agent. Based on this finding, they have completed the invention. Moreover, an antistatic agent having improved coatability by comprising surfactant may cause mixing, which leads to development defects and changes in the developing time, not only in chemically amplified resist but also in non-chemically amplified resist used for microfabrication. In contrast, the inventors have found that the antistatic agent of the present invention has an effect of suppressing mixing both in chemically amplified resist and non-chemically amplified resist.

That is, the present invention relates to an following antistatic agent, an antistatic film, articles coated with the antistatic film and a pattern formation method using the antistatic film.

1. An antistatic agent, comprising a water-soluble electroconductive polymer, a solvent and a water-soluble polymer.

2. The antistatic agent according to 1, wherein the water-soluble polymer is a water-soluble polymer having a polypeptide structure.

3. The antistatic agent according to 1, wherein the water-soluble polymer has a chemical structure represented by formula (10) as a repeating unit.

$$P^1—Z—P^2 \quad (10)$$

(In the formula, $P^1$ represents formula $P^1$ (1) or $P^1$ (2),

  P¹(1)

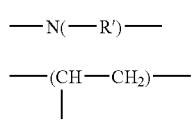  P¹(2)

and when $P^1$ is $P^1$ (1), $P^2$ represents —C(=O)—, Z represents a methylene group —CH(—R)— and in such a condition, formula (10) represents a repeating unit represented by an amino acid residue (10)a.

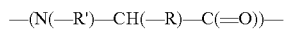 (10)a (In the formula, R and R' each independently represents a substituent constituting an amino acid residue and when R' is a hydrogen atom, R independently represents a substituent constituting an amino acid residue and when R' is not a hydrogen atom, R and R' jointly form a nitrogen-containing ring which may be substituted with a hydroxyl group, and amino acid residue (10)a may be an amino acid residue (10)a'.

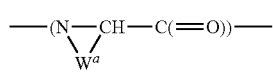 (10)a'

(In the formula, $W^a$ represents a polymethylene group represented by —(CR$^a$R$^b$)n-, substituents R$^a$ and R$^b$ each independently represents a hydrogen atom, an alkyl group or a hydroxyl group and n represents an integer of 2 to 8.)) When $P^1$ is $P^1$ (2), Z is —O— or —N(-Q)-. When Z is —O—, $P^2$ is an alkyl group and formula (10) represents a repeating unit represented by an alkoxyethylene residue (10)b.

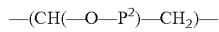 (10)b

When Z is —N(-Q)-, $P^2$ and Q jointly form a lactam ring and formula (10) represents a repeating unit represented by amidoethylene residue (10)c.

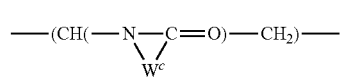 (10)c (In the formula, $W^c$ represents a polymethylene group represented by —(CR$^c$R$^d$)n-, substituents R$^c$ and R$^d$ each independently represents a hydrogen atom or an alkyl group and n represents an integer of 2 to 8.))

4. The antistatic agent according to 1, wherein the water-soluble polymer has at least one kind selected from repeating units represented by structure (10)a, (10)b or (10)c in a molecule.

5. The antistatic agent according to any one of 1 to 4, wherein the water-soluble polymer has a polypeptide structure comprising an amino acid residue (10)a as repeating unit structure.

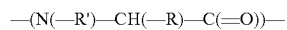 (10)a

6. The antistatic agent according to 1, 3 or 4, wherein the water-soluble polymer has a polyvinyl structure represented by (10)' as repeating unit.

—(CH(—Y—P²)—CH₂)— (10)'

(In the formula, when Y is —O—, $P^2$ is an alkyl group and formula (10)' represents a repeating unit structure represented by alkoxyethylene residue (10)b.

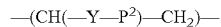 (10)b

When Y is —N(-Q)-, $P^2$ and Q jointly form a lactam ring and formula (10)' represents a repeating unit structure as represented by amidoethylene group (10)c.

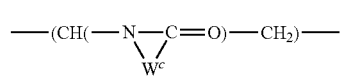 (10)c (In the formula, $W^c$ represents a polymethylene group represented by —(CR$^c$R$^d$)n-, substituents R$^c$ and R$^d$ each independently represents a hydrogen atom or an alkyl group and n represents an integer of 2 to 8.))

7. The antistatic agent according to any one of 2 to 5, wherein the water-soluble polymer having a polypeptide structure is a protein hydrolysate.

8. The antistatic agent according to 1, 3 or 4, wherein the water-soluble polymer is at least one kind selected from the group consisting of polypeptide, polyvinylpyrrolidone, polyvinylcaprolactam and polyvinylalkylether.

9. The antistatic agent according to 8, wherein the water-soluble polymer is polyvinylpyrrolidone.

10. The antistatic agent according to 9, wherein the water-soluble polymer is polyvinylpyrrolidone having a weight average molecular weight of 100,000 or more.

11. The antistatic agent according to any one of 1 to 10, further comprising a surfactant.

12. The antistatic agent according to 1, 2, 3, 4, 5 or 7, wherein the amount of the water-soluble electroconductive polymer is from 0.1 to 20 mass %, the amount of the water-soluble polymer having a polypeptide structure is 0.0001 to 10 mass % and the amount of the solvent is from 70.0 to 99.8 mass %.

13. The antistatic agent according to 1, 3, 4, 6, 8, 9 or 10, wherein the amount of the water-soluble electroconductive polymer is from 0.1 to 20 mass %, the amount of the water-soluble polymer having a polyvinyl structure is 0.0001 to 10 mass % and the amount of the solvent is from 70.0 to 99.8 mass %.

14. The antistatic agent according to 11, wherein the amount of the water-soluble electroconductive polymer is from 0.1 to 20 mass %, the amount of the water-soluble polymer having a polypeptide structure is 0.0001 to 10 mass %, the amount of the surfactant is from 0.0001 to 2 mass % and the amount of the solvent is from 68.0 to 99.8 mass %.

15. The antistatic agent according to 11, wherein the amount of the water-soluble electroconductive polymer is from 0.1 to 20 mass %, the amount of the water-soluble polymer having a polyvinyl structure is 0.0001 to 10 mass %, the amount of the surfactant is from 0.0001 to 2 mass % and the amount of the solvent is from 68.0 to 99.8 mass %.

16. The antistatic agent according to any one of 1 to 15, wherein the water-soluble electroconductive polymer is a n-conjugated conductive polymer having a Bronsted acid group or a salt thereof.

17. The antistatic agent according to 16, wherein the Bronsted acid group is a sulfonic acid group.

18. The antistatic agent according to 17, wherein the water-soluble electroconductive polymer includes a chemical structure represented by formula (1).

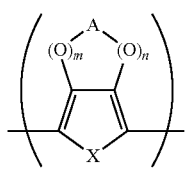

(1)

(In the formula, m and n each independently represents 0 or 1. X represents any one of S, N—$R^1$ ($R^1$ represents a group selected from the group consisting of a hydrogen atom, a linear or branched, saturated or unsaturated hydrocarbon group having 1 to 20 carbon atoms, a phenyl group and a substituted phenyl group) and O, A represents an alkylene or alkenylene group (wherein two or more double bonds may be present) having 1 to 4 carbon atoms which has at least one substituent represented by —B—$SO_3^-M^+$ and may have other substituents, B represents —$(CH_2)_p$—$(O)_q$—$(CH_2)_r$—, p and r each independently represents 0 or an integer of 1 to 3, and q represents 0 or 1. $M^+$ represents a hydrogen ion, an alkali metal ion or a quaternary ammonium ion.)

19. The antistatic agent according to 17, wherein the water-soluble electroconductive polymer includes a chemical structure represented by formula (2).

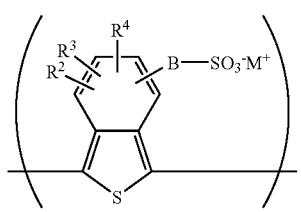

(2)

(In the formula, $R^2$ to $R^4$ each independently represents a hydrogen atom, a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group, a substituted phenyl group or —B—$SO_3^-M^+$ group. B represents —$(CH_2)_p$—$(O)_q$—$(CH_2)_r$—, p and r each independently represents 0 or an integer of 1 to 3, and q represents 0 or 1. $M^+$ represents a hydrogen ion, an alkali metal ion or a quaternary ammonium ion.)

20. The antistatic agent according to 17, wherein the water-soluble electroconductive polymer includes a chemical structure represented by formula (3)

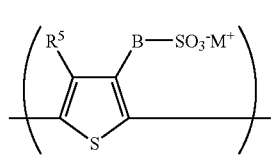

(3)

(In the formula, $R^5$ represents a hydrogen atom, a linear or branched, saturated or unsaturated hydrocarbon group having 1 to 20 carbon atoms, a linear or branched, saturated or unsaturated alloy group having 1 to 20 carbon atoms, a hydroxyl group, a halogen atom, a nitro group, a cyano group, a trihalomethyl group, a phenyl group, a substituted phenyl group or —B—$SO_3^-M^+$ group. B represents —$(CH_2)_p$—$(O)_q$—$(CH_2)_r$—, p and r each independently represents 0 or an integer of 1 to 3, and q represents 0 or 1. $M^+$ represents a hydrogen ion, an alkali metal ion or a quaternary ammonium ion.)

21. The antistatic agent according to 17, wherein the water-soluble electroconductive polymer includes a chemical structure represented by formula (4)

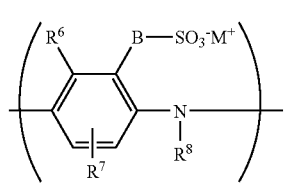

(4)

(In the formula, $R^6$ and $R^7$ each independently represents a hydrogen atom, a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group, a substituted phenyl group or a —$SO_3^-M^+$ group. $R^8$ represents a monovalent group selected from a hydrogen atom, a linear or branched, saturated or unsaturated hydrocarbon group having 1 to 20 carbon atoms, phenyl group and a substituted phenyl group. B represents —$(CH_2)_p$—$(O)_q$—$(CH_2)_r$—, p and r each independently represents 0 or an integer of 1 to 3, and q represents 0 or 1. $M^+$ represents a hydrogen ion, an alkali metal ion or a quaternary ammonium ion.)

22. The antistatic agent according to 19, wherein water-soluble electroconductive polymer is a polymer having 5-sulfoisothianaphthene-1,3-diyl.

23. An antistatic film using the antistatic agent according to any one of 1 to 22.

24. An article coated with the antistatic film according to 23.

25. The coated article according to 24, wherein the surface to be coated is a photosensitive composition or a composition sensitive to charged particle beams which has been spread on a base substrate.

26. A pattern forming method using the antistatic film according to 23.

Effects of Invention

The antistatic agent of the invention does not cause any changes in qualities of a chemically amplified resist (such as changes in shape due to fogging, film-thinning, T-topping or dulling) when applied on the resist surface to form an antistatic coating film. Therefore, the antistatic agent enables pattern formation with excellent precision, with the antistatic effect being capable of preventing mispositioning in lithographic process using charged particle beam. Moreover, the antistatic agent of the present invention not only has an effect of suppressing mixing causing development defects and changes in developing time when used to coat the surface of chemically amplified resist, but also exhibits such an effect in non-chemically amplified resist.

BEST MODE FOR CARRYING OUT THE INVENTION

The antistatic agent according to the invention is a composition comprising a water-soluble electroconductive polymer, a solvent and a water-soluble polymer, especially a water-soluble polymer having a polypeptide structure. Among such water-soluble polymers, the composition contains a water-soluble polymer having an amino acid residue represented by formula (10)a as repeating unit, a water-soluble polymer having an alkoxyethylene residue represented by formula (10)b as repeating unit, a water-soluble polymer having an amidoethylene residue represented by formula (10)c as repeating unit or a water-soluble polymer having a repeating unit structure represented by formula (10) including at least one residue represented by any one of formula (10)a, (10)b, and (10)c as repeating unit. The composition may further comprise surfactant.

After applying the antistatic agent of the invention onto an article and then leaving it to stand or drying it, solvent contained in the antistatic agent decreases through volatilization or the like, the agent loses fluidity and becomes semi-solid or solid. This film without fluidity is herein called "antistatic film".

(I) Water-Soluble Electroconductive Polymer

Examples of water-soluble electroconductive polymer used in the invention include a π-conjugated conductive polymer having a Bronsted acid group or a salt thereof. The Bronsted acid group may be connected to the main chain of π-electron conjugation or may be connected via a spacer (such as alkylene side chain or oxyalkylene side chain). The connection state is not limited by the primary structure of the polymer.

Examples of Bronsted acid group include sulfonic acid group and carboxylic acid group, and preferred is sulfonic acid group.

Examples of the water-soluble electroconductive polymer include copolymers having a repeating unit such as poly (isothianaphthene sulfonic acid), poly(thiophene alkylsulfonic acid), poly(pyrrole alkylsulfonic acid), poly(aniline sulfonic acid), poly(aniline alkane sulfonic acid) or poly (anilinethioalkane sulfonic acid), and self-doping type electroconductive polymers such as salt structures and substituted derivatives of these compounds.

Moreover, in the copolymer, the repeating unit having a sulfonic acid group is usually present in a range of 50 to 100 mol %, preferably 80 to 100 mol %, based on the total repeating units.

The copolymer used in the invention may be a copolymer having a repeating unit constituted by other π-conjugated chemical structures and also may be a copolymer composed of 2 to 5 kinds of repeating units.

Here, the term "copolymer having a repeating unit" used in the present invention is not necessarily limited to a copolymer containing the unit with continuous repetition, and as long as the desired electroconductivity based on π-conjugated main chain can be exhibited, a copolymer such as random copolymer where the repeating unit is contained irregularly or discontinuously may be used.

As examples of the repeating unit having a sulfonic acid group or a salt thereof in the water-soluble electroconductive polymer, chemical structures represented by formulae (1), (2), (3) and (4) may be mentioned.

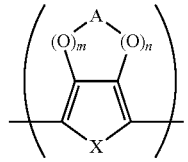

(1)

In the formula, m and n each independently represents 0 or 1. X represents any one of S, N—$R^1$ and O, $R^1$ represents a hydrogen atom or one selected from the group consisting of a linear or branched, saturated or unsaturated hydrocarbon group having 1 to 20 carbon atoms, a phenyl group and a substituted phenyl group, A represents an alkylene or alkenylene group (wherein two or more double bonds may be present) having 1 to 4 carbon atoms which has at least one substituent represented by —B—$SO_3^-M^+$ and may have other substituents, B represents —$(CH_2)_p$—$(O)_q$—$(CH_2)_r$—, p and r each independently represents 0 or an integer of 1 to 3, and q represents 0 or 1. $M^+$ represents a hydrogen ion, an alkali metal ion or a quaternary ammonium ion.

As other substituents, the alkylene or alkenylene group may have at least one selected from the group consisting of a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group or a substituted phenyl group.

Examples of substituent for the substituted phenyl group represented by $R^1$ and substituent for the above substituted phenyl group include alkyl group having 1 to 8 carbon atoms, alkoxy group having 1 to 8 carbon atoms and halogen atom and the substituted phenyl group is a phenyl group substituted by 1 to 5 substituents selected from these examples.

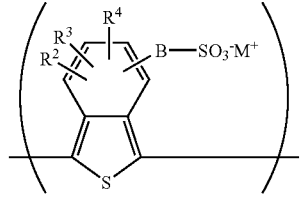

(2)

In the formula, $R^2$ to $R^4$ each independently represents a hydrogen atom, a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group, a substituted phenyl group or —B—SO$_3^-$M$^+$. B and M$^+$ have the same meanings as defined above.

Examples of substituent for the substituted phenyl group represented by R$^2$, R$^3$ or R$^4$ include alkyl group having 1 to 8 carbon atoms, alkoxy group having 1 to 8 carbon atoms and halogen atom and the phenyl group may be substituted by multiple substituents.

Any ethylene group in the hydrocarbon group or the alkoxy group represented by R$^2$, R$^3$ and R$^4$ may be substituted by a carbonyl group (—CO—), an oxy group (—O—), a carbonyloxy group (—COO— or —OCO—), an aminocarbonyl group (—NH$_2$—CO— or —CO—NH$_2$—), an aminosulfonyl group (—NH$_2$—SO$_2$— or —SO$_2$—NH$_2$—), a sulfanil group (—S—), a sulfinyl group (—S(O)—), sulfonyl group (—SO$_2$—), a sulfonyloxy group (—SO$_2$—O— or —O—SO$_2$—), or an imino group (—NH—).

Specific examples include alkyl carbonylalkyl group, alkoxyalkyl group, alkoxyalkoxy group, alkoxycarbonyl group, alkoxycarbonylalkyl group, acyloxy group, acyloxyalkyl group, alkylaminocarbonyl group, alkylaminocarbonylalkyl group, alkylcarbonylamino group, alkylcarbonylaminoalkyl group, alkylaminosulfonyl group, alkylaminosulfonylalkyl group, alkylsulfonylamino group, alkylsulfonylaminoalkyl group, alkylthio group, alkylthioalkyl group, alkylsulfinyl group, alkylsulfinylalkyl group, alkylsulfonyl group, alkyl sulfonylalkyl group, alkylsulfonyloxy group, alkylsulfonyloxy alkyl group, alkylamino group, and those in which the alkyl part is substituted by substituted or unsubstituted phenyl group. Substituents for the phenyl group are the same as those mentioned above as the examples of substituents for substituted phenyl group represented by R$^2$ to R$^4$.

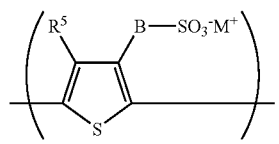

(3)

In the formula, R$^5$ has the same meaning as the meanings of R$^2$ to R$^4$ defined above, and B and M$^+$ have the same meanings as defined above.

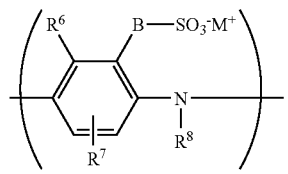

(4)

In the formula, R$^6$ and R$^7$ each independently represents the same meaning as those of R$^2$ to R$^4$ defined above, B and M$^+$ have the same meanings as defined above, R$^8$ represents one selected from the group consisting of a hydrogen atom, a linear or branched, saturated or unsaturated hydrocarbon group having 1 to 20 carbon atoms, a phenyl group and a substituted phenyl group. Substituents for the phenyl group represented by R$^8$ are the same as those mentioned above as substituents for the phenyl group represented by R$^2$ to R$^4$.

The term "saturated or unsaturated hydrocarbon group" in the definitions of formulae (1) to (4) means a group constituted by carbon atoms and hydrogen atoms. Examples thereof include alkyl group, alkenyl group, alkynyl group, cycloalkyl group, cycloalkenyl group, cycloalkylnyl group, aromatic hydrocarbon ring and those in which one or more hydrogen atoms of these groups are substituted by other substituents.

Preferred as R$^2$ to R$^5$ are hydrogen atom, linear or branched alkyl group having 1 to 20 carbon atoms and linear or branched alkoxy group having 1 to 20 carbon atoms and more preferred are hydrogen atom and linear or branched alkoxy group having 1 to 20 carbon atoms. Preferred as R$^6$ or R$^7$ are hydrogen atom, linear or branched, saturated or unsaturated hydrocarbon group having 1 to 20 carbon atoms, phenyl group and substituted phenyl group.

Particularly preferred examples of R$^2$ to R$^7$ include hydrogen atom, alkyl group, alkenyl group, alkoxy group, alkoxyalkyl group, carbonyl group-containing group, alkoxyalkoxy group, alkoxycarbonyl group, acyloxy group, phenyl group, substitute phenyl group and sulfonic acid group. Specific examples of these substituents include alkyl groups such as methyl, ethyl, propyl, allyl, isopropyl, butyl, pentyl, hexyl, heptyl, octyl, nonyl, decyl, undecyl, dodecyl, tetradecyl, hexadecyl, alkenyl groups such as vinyl, 1-propinyl and 1-butenyl, alkoxy alkyl groups such as ethoxyethyl, methoxyethyl and methoxyethoxyethyl, carbonyl group-containing groups such as acetonyl and phenacyl, alkoxy groups such as methoxy, ethoxy, propoxy, isopropoxy, butoxy, pentyloxy, hexyloxy, octyloxy and dodecyloxy, alkoxyalkoxy groups such as methoxyethoxy and methoxyethoxyethoxy, alkoxy carbonyl groups such as methoxy carbonyl, ethoxy carbonyl and butoxy carbonyl, acyloxy groups such as acetoxy and butyroyloxy and phenyl groups such as phenyl, fluorophenyl, chlorophenyl, bromophenyl, methylphenyl and methoxyphenyl, which may have substituents such as halogen atom, and alkyl or alkoxy group.

In the formulae (1) to (4), preferred examples of B include single bond, methylene, ethylene, propylene, butylene, pentylene, hexylene, arylene, butadienylene, oxymethylene, oxyethylene, oxypropylene, methyleneoxyethylene and ethyleneoxyethylene. Particularly preferred examples of B include single bond, ethylene, propylene, oxyethylene and ethyleneoxyethylene.

Cations represented by M$^+$ may be present as two or more species.

Examples of alkali metal ion include Na$^+$, Li$^+$ and K$^+$.

The quaternary ammonium ion is represented by N(R$^9$)(R$^{10}$)(R$^{11}$)(R$^{12}$)$^+$. In the formula, each of R$^9$ to R$^{12}$ independently represents a hydrogen atom, a linear or branched, substituted or unsubstituted alkyl group having 1 to 30 carbon atoms, substituted or unsubstituted aryl group, or may represent an alkyl or aryl group which has a group containing atom(s) other than carbon and hydrogen, such as alkoxy group, hydroxyl group, oxyalkylene group, thioalkylene group, azo group, azo benzene group and p-diphenyleneoxy group.

As quaternary ammonium ion, for example, an unsubstituted type or alkyl- or aryl-substituted type cation such as NH$_4^+$, NH(CH$_3$)$_3^+$, NH(C$_6$H$_5$)$_3^+$ and N(CH$_3$)$_2$(CH$_2$OH)(CH$_2$—Z)$^+$ (provided that Z represents an arbitrary substituent of chemical formula weight of 600 or less, and examples thereof include phenoxy group, p-diphenyleneoxy group, p-alkoxydiphenyleneoxy group and p-alkoxyphenylazophenoxy group) is used. Also, in order to convert the ion into a specific cation, a conventional ion exchanger resin may be used.

Any ethylene in alkyl groups of $R^9$ to $R^{12}$ may be substituted by carbonyl group (—CO—), oxy group (—O—), carbonyloxy group (—COO— or —OCO—), aminocarbonyl group (—NH$_2$—CO— or —CO—NH$_2$—), aminosulfonyl group (—NH$_2$—SO$_2$— or —SO$_2$—NH$_2$—), sulfanyl group (—S—), sulfinyl group (—S(O)—), sulfonyl group (—SO$_2$—), sulfonyloxy group (—SO$_2$—O— or —O—SO$_2$—), or imion group (—NH—).

Preferred examples of chemical structure represented by formula (1), (2) or (3) include 5-(3'-propanesulfo)-4,7-dioxycyclohexa[2,3-c]thiophene-1,3-diyl, 5-(2'-ethanesulfo)-4,7-dioxycyclohexa[2,3-c]thiophene-1,3-diyl, 5-sulfoisothianaphthene-1,3-diyl, 4-sulfoisothianaphthene-1,3-diyl, 4-methyl-5-sulfoisothianaphthene-1,3-diyl, 6-methyl-5-sulfoisothianaphthene-1,3-diyl, 6-methyl-4-sulfoisothianaphthene-1,3-diyl, 5-methyl-4-sulfoisothianaphthene-1,3-diyl, 6-ethyl-5-sulfoisothianaphthene-1,3-diyl, 6-propyl-5-sulfoisothianaphthene-1,3-diyl, 6-butyl-5-sulfoisothianaphthene-1,3-diyl, 6-hexyl-5-sulfoisothianaphthene-1,3-diyl, 6-decyl-5-sulfoisothianaphthene-1,3-diyl, 6-methoxy-5-sulfoisothianaphthene-1,3-diyl, 6-ethoxy-5-sulfoisothianaphthene-1,3-diyl, 6-chloro-5-sulfoisothianaphthene-1,3-diyl, 6-bromo-5-sulfoisothianaphthene-1,3-diyl, 6-trifluoromethyl-5-sulfoisothianaphthene-1,3-diyl, 5-(sulfomethane)isothianaphthene-1,3-diyl, 5-(2'-sulfoethane)isothianaphthene-1,3-diyl, 5-(2'-sulfoethoxy)isothianaphthene-1,3-diyl, 5-(2'-(2''-sulfoethoxy)methane)-isothianaphthene-1,3-diyl and 5-(2'-(2''-sulfoethoxy)ethane)-isothianaphthene-1,3-diyl, and lithium salt, sodium salt, ammonium salt, methylammonium salt, ethylammonium salt, dimethylammonium salt, diethylammonium salt, trimethylammonium salt, triethylammonium salt, tetramethylammonium salt and tetraethylammonium salt thereof.

Preferred examples of chemical structure represented by formula (4) include 2-sulfo-1,4-iminophenylene, 3-methyl-2-sulfo-1,4-iminophenylene, 5-methyl-2-sulfo-1,4-iminophenylene, 6-methyl-2-sulfo-1,4-iminophenylene, 5-ethyl-2-sulfo-1,4-iminophenylene, 5-hexyl-2-sulfo-1,4-iminophenylene, 3-methoxy-2-sulfo-1,4-iminophenylene, 5-methoxy-2-sulfo-1,4-iminophenylene, 6-methoxy-2-sulfo-1,4-iminophenylene, 5-ethoxy-2-sulfo-1,4-iminophenylene, 2-sulfo-N-methyl-1,4-iminophenylene and 2-sulfo-N-ethyl-1,4-iminophenylene, and lithium salt, sodium salt, ammonium salt, methylammonium salt, ethylammonium salt, dimethylammonium salt, diethylammonium salt, trimethylammonium salt, triethylammonium salt, tetramethylammonium salt and tetraethylammonium salt thereof.

Further, examples of the water-soluble electroconductive polymer used in the present invention other than the above formulae (1) to (4), poly(carbazole-N-alkanesulfonic acid), poly(phenylene-oxyalkanesulfonic acid), poly(phenylenevinylene-alkanesulfonic acid), poly(phenylenevinylene-oxyalkanesulfonic acid), poly(aniline-N-alkanesulfonic acid), poly(thiophenealkylcarboxylic acid), poly(thiophenenoxyalkylcarboxylic acid), poly(polypyrrolealkylcarboxylic acid), poly(pyrroleoxyalkylcarboxylic acid), poly(carbazole-N-alkylcarboxylic acid), poly(phenylene-oxyalkylcarboxylic acid), poly(phenylenevinylene-alkylcarboxylic acid), poly(phenylenevinylene-oxyalkylcarboxylic acid), poly(aniline-N-alkylcarboxylic acid) and substituted derivatives thereof, 6-sulfonaphtho[2,3-c]thiophene-1,3-diyl and lithium salt, sodium salt, ammonium salt, methylammonium salt, ethylammonium salt, dimethylammonium salt, diethylammonium salt, trimethylammonium salt, triethylammonium salt, tetramethylammonium salt and tetraethylammonium salt thereof.

The molecular weight of the water-soluble electroconductive polymer used in the present invention is, if expressed in terms of the number of repeating units constituting the main chain (polymerization degree), usually from 5 to 2000, preferably from 10 to 1000.

Particularly preferable examples of the water-soluble electroconductive polymer used in the present invention include polymer of 5-sulfoisothianaphthene-1,3-diyl, random copolymer containing 80 mol % or more of 5-sulfoisothianaphthene, poly(5-sulfoisothianaphthene-1,3-diyl-co-isothianaphthene-1,3-diyl), poly(3-(3-thienyl)ethanesulfonic acid), poly(3-(3-thienyl)propanesulfonic acid), poly(2-(3-thienyl)oxyethanesulfonic acid), random copolymer containing 50 mol % or more of 2-sulfo-1,4-iminophenylene, poly(2-sulfo-1,4-iminophenylene-co-1,4-iminophenylene) and lithium salt, sodium salt, ammonium salt and triethylammonium salt thereof.

(II) Solvent

Solvent used in the invention is miscible with water and can dissolve water-soluble polymer and water-soluble electroconductive polymer. Examples of the solvent include water, ethers such as 1,4-dioxane and tetrahydrofuran, carbonates such as dimethyl carbonate, diethyl carbonate, ethylene carbonate and propylene carbonate, nitriles such as acetonitrile and benzonitrile, alcohols such as methanol, ethanol, propanol and isopropanol, aprotic solvents such as N,N-dimethylformamide, dimethylsulfoxide and N-methyl-2-pyrrolidone, inorganic acids such as sulfuric acid and organic acids such as acetic acid. One of these solvents may be used singly or a mixture solvent of two or more of them may be used.

(III) Water-soluble polymer

As water-soluble polymer used in the present invention a water-soluble polymer having a polypeptide structure and a water-soluble polymer having a repeating unit represented by formula (10) are preferred.

$$P^1\text{—}Z\text{—}P^2 \tag{10}$$

(In the formula, $P^1$ represents formula $P^1$ (1) or $P^1$ (2).

$$P^1(1)$$

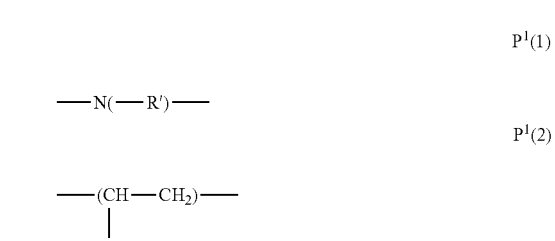

$$P^1(2)$$

When $P^1$ is $P^1$ (1), $P^2$ represents —C(=O)—, Z represents a methylene group —CH(—R)— and in such a condition, formula (10) represents a repeating unit represented by an amino acid residue (10)a.

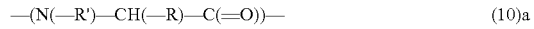

$$—(N(—R')—CH(—R)—C(=O))— \tag{10a}$$

(In the formula, R and R' each independently represents a substituent constituting an amino acid residue and when R' is a hydrogen atom, R independently represents a substituent constituting an amino acid residue and when R' is not a hydrogen atom, R and R' jointly form a nitrogen-containing ring which may be substituted with a hydroxyl group, and amino acid residue (10)a may be an amino acid residue (10)a'.

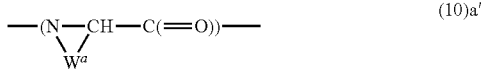

(In the formula, $W^a$ represents a polymethylene group represented by $-(CR^aR^b)n-$, substituents $R^a$ and $R^b$ each independently represents a hydrogen atom, an alkyl group or a hydroxyl group and n represents an integer of 2 to 8.)) Formula (10)a' preferably represents a repeating unit structure (polypeptide structure) represented by formula (10)a"

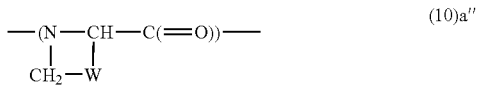

(In the formula, W represents an ethylene group in which any carbon atom may be substituted by hydroxyl group) substituents $R^a$ and $R^b$ each independently represents a hydrogen atom, an alkyl group or a hydroxyl group and n represents an integer of 2 to 8.)
When $P^1$ is $P^1$ (2), Z is —O— or —N(-Q)-. When Z is —O—, $P^2$ is an alkyl group and formula (10) represents a repeating unit represented by an alkoxyethylene residue (10)b.

When Z is —N(-Q)-, $P^2$ and Q jointly form a lactam ring and formula (10) represents a repeating unit represented by amidoethylene residue (10)c.

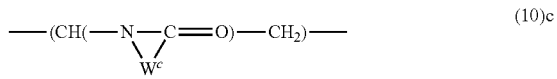

(In the formula, $W^c$ represents a polymethylene group represented by $-(CR^cR^d)n-$, substituents $R^c$ and $R^d$ each independently represents a hydrogen atom or an alkyl group and n represents an integer of 2 to 8.) Preferably, the water-soluble polymer having a repeating unit (10)c' (polyvinyllactam structure) as the repeating unit (10)c.

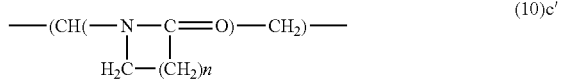

(In the formula, n is an integer of 1 to 7.))
[Water-Soluble Polymer Having a Polypeptide Structure]
The water-soluble polymer having a polypeptide structure used in the invention is a water-soluble polymer having a polypeptide structure containing the above amino acid residue (10)a as repeating unit.

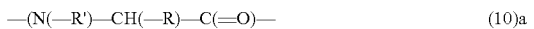

Such a polymer can be obtained by a method of hydrolyzing proteins, a method of synthesis from arbitrary amino acid or oligopeptide or a production method using living bodies such as microorganisms. In case of hydrolyzing proteins, protein to be used is preferably a naturally-derived protein which widely occurs in nature and is easily available. For example, keratin and collagen are fibrous proteins and structural proteins which constitute living bodies. Examples of synthesizing polypeptide from arbitrary amino acid include a method where condensation between two amino acid molecules or derivatives thereof (e.g. or acid chloride) is repeated to thereby allow each of the amino acid residue to form a peptide bond (e.g. amino acid residue represented by (10)a), a method where N-carboxy anhydride is polymerized and Merrifield solid-phase peptide synthesis method where a reacting group is attached to polymer such as polystyrene film and one kind of amino acid is bonded thereto and after converting the amino acid into a structure more reactive, another type of amino acid is bonded. Examples of amino acid residue (10)a include amino acid residues of glycine (Gly), alanine (Ala), valine (Val), leucine (Leu), isoleucine (Ile), serine (Ser), threonine (Thr), aspartic acid (Asp), asparagine (Asn), glutamic acid (Glu), glutamine (Gln), cysteine (Cys), methionine (Met), lysine (Lys), arginine (Arg), histidine (His), phenylalanine (Phe) tyrosine (Tyr), tryptophan (Trp), proline (Pro), 3-hydroxyproline (3Hyp) and 4-Hydroxyproline (4Hyp) (in the parentheses are three-letter codes for the amino acids).

Examples of protein hydrolysate include animal-derived hydrosates such as hydrolyzed collagens such as hydrolysates of bovine hide gelatin, pig hide gelatin, fishskin gelatin and collagen contained in many fish scales, hydrolyzed keratins as hydrolysates of keratins contained mainly in wool and plume, and casein hydrolysates such as hydrolysates of caseins contained mainly in milk. Further, examples thereof include vegetable proteins such as silk hydrolysate derived from silk, casein hydrolysates derived from soy bean protein, and hydrolysates of conchiolin and wheat protein.

Water-soluble polymer having a polypeptide structure, which has various amino acids as above mentioned, is easy to be chemically modified. In the invention, various derivatives having been subjected to chemical modification may also be used. Examples of chemical modification include conversion of amino group at polypeptide terminal into quaternary ammonium cation and silylation thereof and esterification of terminal carboxylic group. Conversion into quaternary ammonium cation can be applicable not only to amino group at polypeptide terminal but also to the side chain of basic amino acid in lycine and histidine. Moreover, for the purpose of solvent-solubilization or imparting surface-active effect, various aliphatic acids may be condensed.

[Water-Soluble Polymer Having a Polyvinyl Structure as Repeating Unit]

As water-soluble polymer having a polyvinyl structure as repeating unit used in the invention, a water-soluble polymer having a polyvinyl structure as repeating unit represented by formula (10)' is preferable.

(In the formula, when Y is —O—, $P^2$ is an alkyl group and formula (10)' represents a repeating unit structure (polyvinylalkylether structure) represented by alkoxyethylene residue (10)b.

When Y is —N(-Q)-, $P^2$ and Q jointly form a lactam ring and formula (10)' represents a repeating unit structure as represented by amidoethylene group (10)c.

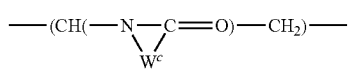 (10)c (In the formula, $W^c$ represents a polymethylene group represented by $-(CR^cR^d)n-$, substituents $R^c$ and $R^d$ each independently represents a hydrogen atom or an alkyl group and n represents an integer of 2 to 8.) Among those represented by (10) c, a water-soluble polymer having a repeating unit represented by formula (10)c' (polyvinyl lactam structure) as a chemical structure (polyvinyl structure) is more preferred.

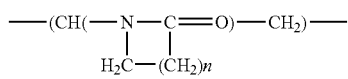 (10)c'

(In the formula, n is an integer of 1 to 7.)

There is no particular limitation on method for producing water-soluble polymer having a polyvinyl structure as repeating unit in the present invention. For example, such a target water-soluble polymer can be obtained by polymerizing at least one kind of polymer having a corresponding vinyl group with polymerization catalyst such as peroxide, subsulfate, azo catalyst, boron fluoride and aluminium chloride. That is, for example, a water-soluble polymer having a polyvinyl structure as repeating unit (polyvinyl structure) represented by (10)' can be produced by polymerizing one monomer having a vinyl group represented by formula (20) singly or copolymerizing two or more of such monomers with polymerization catalyst.

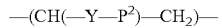 (10)'

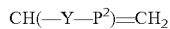 (20)

That is, the water-soluble polymer having a polyvinyl structure as repeating unit represented by (10)' which is particularly preferably used in the present invention can be obtained by polymerizing at least one monomer having a vinyl group represented by formula (20).

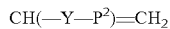 (20)

(In the formula, when Y is -o-, $P^2$ is an alkyl group, and formula (20) represents a vinylalkylether represented by formula (20)b.

 (20)b

When Y is $-N(-Q)-$, $P^2$ and Q jointly form a lactam ring and formula (20) represents N-vinyllactam represented by formula (20)c.

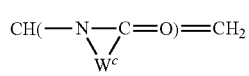 (20)c (In the formula, $W^c$ represents a polymethylene group represented by $-(CR^cR^d)n-$, substituents $R^c$ and $R^d$ each independently represents a hydrogen atom or an alkyl group and n is an integer of 2 to 8.) Among those represented by formula (20)c, formula (20)c' is preferred.

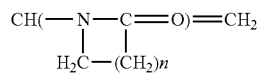 (20)c'

(In the formula, n is an integer of 1 to 7.)) The obtained target water-soluble polymer is preferably a water-soluble polymer having a chemical structure (polyvinyl structure) as repeating unit represented by formula (10)'.

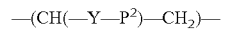 (10)'

(In the formula, when Y is —O—, $P^2$ is an alkyl group and formula (19)' represents a repeating unit structure (polyvinylalkylether structure) of an alkoxyethyle residue represented by formula (10)b.

 (10)b

When Y is $-N(-Q)-$, $P^2$ and Q jointly form a lactam ring and formula (10)' represents a repeating unit structure of amidoethylene residue represented by formula (10)c.

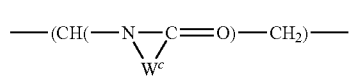 (10)c (In the formula, $W^c$ represents a polymethylene group represented by $-(CR^cR^d)n-$, substituents $R^c$ and $R^d$ each independently represents a hydrogen atom or an alkyl group and n is an integer of 2 to 8.) Among those represented by formula (10)c, a repeating unit structure (polyvinyl lactam structure) represented by formula (10)c' is preferred.

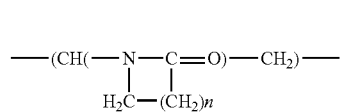 (10)c'

(In the formula, n is an integer of 1 to 7.)

As $P^2$, $R^a$, $R^b$, $R^c$ and $R^d$ in the alkyl group, linear or branched, cyclic or chain alkyl group having 1 to 20 carbon atoms is preferred and examples thereof include linear or branched, chain alkyl group such as methyl group, ethyl group, n-propyl group, isopropyl group, n-butyl group, i-butyl group, sec-butyl group, t-butyl group, pentyl group, hexyl group, heptyl group, octyl group, nonyl group, decyl group, undecyl group, dodecyl group, tetradecyl group and hexadecyl group and cyclic alkyl groups such as cyclopropyl group, cyclobutyl group, cyclopentyl group, cyclohexyl group, cycloheptyl group and cyclooctyl group. Among these, alkyl group having 1 to 8 carbon atoms is preferred, and lower alkyl group having 1 to 4 carbon groups such as methyl group, ethyl group, n-propyl group, i-propyl group, n-butyl group, i-butyl group, sec-butyl group and t-butyl group is more preferred. With respect to the methylene group "$-(CH_2)n-$" forming a lactam ring in the above N-vinyl lactam (20)c and above amidoethylene residue (10)c, n is preferably an integer of 1 to 7, more preferably 1 to 5.

As the lactam ring formed jointly by P² and Q, particularly preferred examples (n=n)

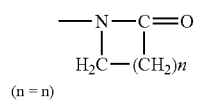
(n = n)

include a lactam ring wherein n is 1 (β-propiolactam group),

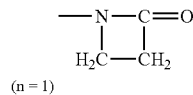
(n = 1)

a lactam ring wherein n is 2 (γ-butyrolactam group=lactum ring of vinyl pyrrolidone or polymer thereof)

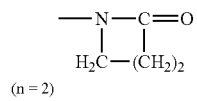
(n = 2)

a lactam ring wherein n is 3 (δ-valerolactam group),

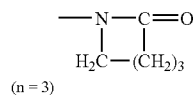
(n = 3)

a lactam ring wherein n is 4 (ε-caprolactam group=lactam ring of vinylcaprolactam or polymer thereof)

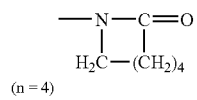
(n = 4)

and a lactam ring wherein n is 5.

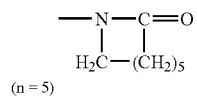
(n = 5)

Examples of particularly preferred water-soluble polymer having the above described polyvinyl structure include polyvinyl pyrrolidone, polyvinyl caprolactam, copolymers thereof, polyvinylmethylether, polyvinylethylether and copolymers thereof. The copolymerization ratio of copolymer may be arbitrary selected. Any polymer may be used as long as it is soluble in water. The preferable range of the weight average molecular weight of the water-soluble polymer is, although it is different depending on the type of the monomer used, generally from 1,000 to 2,000,0000), more preferably 5,000 to 2,000,000. If the molecular weight is too low, not only may the obtained effects be insufficient, but also may the resist be dissolved. If the molecular weight exceeds 2,000,000, it may be difficult to solve the polymer or the viscosity of the composition may be too much increased, which makes coating process difficult. With respect to polyvinylpyrrolidone, generally polyvinylpyrrolidone having a weight-average molecular weight of 100,000 or more, preferably a range of 800,000 to 2,000,000, more preferably a range of 1,000,000 to 1,800,000 is used. If the molecular weigh is less than 100,000, effects as desired cannot be obtained.

The specific water-soluble polymer having the above-described polyvinyl structure as repeating unit structure in the present invention can prevent mixing with resist by comprising such a structure in combination with surfactant, while maintaining good coatability of the composition. It is observed that the effect of preventing mixing of the specific water-soluble polymer having the above-described polyvinyl structure as repeating unit structure in the present invention water depends on the concentration and generally, the polymer is used in an amount of 0.0001 to 10 mass %, more preferably 0.01 to 2 mass %. If the amount is too small, the effect of preventing mixing with resist may be insufficient. If the amount is too large, with the ratio of the electroconductive polymer being smaller, electroconductivity may be decreased. Specifically, the effect of preventing mixing can be observed in water-soluble polymers having a polyvinyl lactam structure such as polyvinyl pyrrolidone, polyvinyl caprolactam, polymers and copolymers thereof. In case of polyvinylpyrrolidone, the effect of preventing mixing depends on the molecular weight and therefore the larger the molecular weight, the greater the effect tends to be. Similarly, the above-described water-soluble polymer having a polyvinylalkylether structure also has the effect of preventing mixing. The above-described water-soluble polymer having a polyvinyl structure contained in the composition according to the present invention does not adversely affect the resist. In contrast, when using polyaclyric acid, polyacryl amide or polystyrene sulfonic acid as water-soluble polymer, regardless of the molecular weight, mixing with resist cannot be suppressed. That is, when surfactant and such a water-soluble polymer are contained in electroconductive polymer, coatability is increased while mixing occurs and in case of negative type resist, developing time is prolonged. Moreover, water-soluble polymer having a basic residue such as polyvinyl imidazole, polyallylamine and polyethylene imine, when used in combination with water-soluble electroconductive polymer having a sulfonic acid group, may cause precipitation, which is not preferred.

The antistatic agent of the present invention, particularly the antistatic agent using a water-soluble polymer having the above-described polypeptide structure and the antistatic agent using a specific water-soluble polymer having the above-described polyvinyl structure as repeating unit have an effect of suppressing mixing with resist not only in case of using chemically amplified resist but also in case of using non-chemically amplified resist. That is, the antistatic agent using water-soluble polymer having a polypeptide or polyvinyl structure as repeating unit has an effect of suppressing mixing with resist not only in case of using negative-type chemically amplified resist but also in case of using non-chemically amplified resist. Furthermore, in case of using the antistatic agent using a specific water-soluble polymer having a polyvinyl structure as repeating unit or the antistatic agent using a water-soluble polymer having a polypeptide structure, film thinning in positive-type chemically amplified resist is decreased. Moreover, the antistatic agent of the present invention can suppress influence of surfactant on resist in both cases using chemically amplified resist and non-chemically amplified resist, with the contact angle being maintained low.

Water-soluble polymer having the above-described polypeptide structure and specific water-soluble polymer having the above-described polyvinyl structure as repeating unit do not cause mixing with chemically amplified resist. Further, even when the antistatic agent contains surfactants described later and the like which cause mixing with resist, mixing with resist can be prevented by containing water-soluble polymer having the above-described polypeptide structure and specific water-soluble polymer having the above-described polyvinyl structure as repeating unit.

(IV) Surfactant

Surfactant used in the invention is not particularly limited as far as it exhibits surface active effects, and any one of anionic surfactants, cationic surfactants, ampholytic surfactants and nonionic surfactants.

Examples of anionic surfactant include alkyl ether carboxylic acid, linear alkyl benzenesulfonic acid, α-olefinsulfonic acid, alkane sulfonate, dialkyl sulfosuccinic acid, naphthalenesulfonate formaldehyde condensate, alkyl sulfuric acid ester, polyoxyethylene alkyl ether sulfuric acid ester, polyoxyethylene alkylphenyl ether sulfuric acid ester, higher alcohol phosphoric acid ester, phosphoric acid ester of higher alcohol ethylene oxide adduct, acyl-N-methyl taurine and salts of these compounds.

Examples of cationic surfactant include monoalkyl ammonium, dialkyl ammonium, ethoxylated ammonium, quaternary amine, alkylamine acetic acid, and salts of these compounds.

Example of ampholytic surfactant include lauryldimethyl amino acetic acid betaine, stearyl dimethylamino acetic acid betaine, lauryl dimethylamine oxide, 2-alkyl N-carboxymethyl-N-hydroxyethylimidazolinium betaine, lauric acid amidopropyl betaine, laurylhydroxy sulfobetaine, alanine and salts thereof.

Examples of nonionic surfactant include glycerine fatty acid ester, propylene glycol fatty acid ester, sorbitan fatty acid ester, sucrose fatty acid ester, polyethylene glycol fatty acid ester, polyoxyethylene alkyl ether, alkyl glyceryl ether, polyoxyethylene alkylphenyl ether, polyoxyethylene polyoxypropylene ether, polyoxyalkylene alkylether, acetylene glycol, polyoxyethylene sorbitan fatty acid ester, polyoxyethylene sorbitol fatty acid ester, alkyl glyceryl ether, fatty acid alkylene oxide adduct, polyoxyethylene hydrogenated castor wax, fatty acid alkanolamide, fatty acid amide alkylene oxide adduct, amine EO adduct and amine PO adduct.

One of these surfactants may be used singly or a mixture of two or more of them may be used. Preferably, it is at least one kind of anionic surfactant or ampholytic surfactant, and may be used in form of a mixture with compounds such as ampholytic surfactant, nonionic surfactant, cationic surfactant and water-soluble polymer which have surface activating effect.

(V) Blending Amount

Preferable blending amounts of the components of the antistatic agent of the present invention are from 0.1 to 20 mass % for the water-soluble electroconductive polymer, from 0.0001 to 10 mass % for the water-soluble polymer having a polypeptide structure or the specific water-soluble polymer having a polyvinyl structure as repeating unit, and from 70.0 to 99.8 mass % for the solvent. More preferred are from 0.2 to 5 mass % for the water-soluble electroconductive polymer, from 0.01 to 2 mass % for the water-soluble polymer having a polypeptide structure or the specific water-soluble polymer having a polyvinyl structure as repeating unit, and from 93 to 99.7 mass % for the solvent.

In case of a composition containing surfactant, preferable amounts are from 0.1 to 20 mass % for the water-soluble electroconductive polymer, from 0.0001 to 10 mass % for the water-soluble polymer having a polypeptide structure or the specific water-soluble polymer having a polyvinyl structure as repeating unit, from 0.0001 to 2 mass % for the surfactant and from 68.0 to 99.8 mass % for the solvent. More preferred are from 0.2 to 5 mass % for the water-soluble electroconductive polymer, from 0.01 to 2 mass % for the water-soluble polymer having a polypeptide structure or the specific water-soluble polymer having a polyvinyl structure as repeating unit, 0.0001 to 10 mass % for the surfactant and from 83 to 99.7 mass % for the solvent.

If the amount of the water-soluble polymer having a polypeptide structure or the specific water-soluble polymer having a polyvinyl structure as repeating unit is less than 0.0001 mass %, effect of preventing formation of mixing layer in resist cannot be expected. Further, the amount exceeding 10 mass %, which may cause decrease in electroconductivity, is not preferable. Water solubility of the water-soluble polymer having a polypeptide structure or the specific water-soluble polymer having a polyvinyl structure as repeating unit used in the present invention is the solubility with in a range of the blending amount which does not disturb the above effect of the invention.

(VI) Uses

The antistatic agent of the present invention can be used both in non-chemically-amplified resist and in chemically-amplified resist and further, can be used both in positive-type resist and in negative-type resist.

In a non-chemically-amplified resist, the antistatic agent of the present invention is effective as antistatic treatment agent having an excellent coatability. Examples of non-chemically-amplified resist include phenol resins such as novolak resin, acrylic resins such as polymethylmethacrylate resin and polyacrylate resin, copolymer types of α-methylstyrene and α-chloroacrylic acid and calixarene.

In addition, non-chemically amplified resists include inorganic resists and examples thereof include resist obtained by dissolving hydrogen silsesquioxane (HSQ) in methyl isobutylketone. HSQ is generally used in inter-layer insulating film in semiconductor devices such as flash memory device and the resist is strongly hydrophobic. Such a resist sometimes causes mixing with some antistatic agent.

In a chemically amplified resist, more effective prevention of formation of a mixing layer in the contacting interface between the antistatic film of the present invention and the resist is observed. Examples of chemically amplified resist include photosensitive resins such as phenol resin types, acrylic resin types and azide compound types, and resins sensitive to electrically charged particles such as polymethacrylate resin types, polyvinylphenol types, polyhydroxystyrene types and copolymer types of α-methyl styrene and α-chloroacrylic acid.

Further, additives such as photosensitizing agent, azide compound, crosslinking agent, dissolution inhibitor and acid generator may be added to the non-chemically amplified resist and the chemically amplified resist.

In the antistatic agent of the present invention, a compound represented by $M^+$—$OH^-$ (in the formula, $M^+$, which has the same meaning as afore-defined, represents a hydrogen ion, an alkali metal ion or a quaternary ammonium ion) can be used for the purpose of neutralizing the Bronsted acid of the water-soluble electroconductive polymer and other additives contained in the solution. By adjusting the amount of the compound, the pH of the antistatic agent can be arbitrarily adjusted within a range from acid to alkaline.

The preferable pH range of the antistatic agent of the present invention is from 2 to 9, more preferably from 3 to 8. In case of using a chemically amplified resist, if the pH of the antistatic agent is less than 2, the proton concentration becomes high, which may adversely affect developability of the resist. If the pH exceeds 9, dedoping occurs in the water-soluble electroconductive polymer, which may decrease electroconductivity.

The antistatic agent of the present invention is applied onto the resist surface to form an antistatic film. As a method for coating the resist surface with the antistatic agent, spin-coating is preferably employed, however, other methods, for example, dipping method, spraying method and bar coater method may also be employed. After coating, an antistatic film is formed by air-drying at room temperature or heating the base substrate coated with resist on a hot plate. Also, heating treatment in inert gas atmosphere is preferable in light of removal of solvent.

Examples of product coated with the antistatic film of the present invention include a substrate having the antistatic film and a resist film laminated thereon. Examples of material for the substrate include silicon wafer, compound semiconductor wafers such as gallium arsenide wafer and indium phosphorus wafer, a quartz substrate, a glass substrate and a magnetic material substrate. Also, the antistatic film can coat materials optionally selected, as in a case where formation is conducted by using ion beam without using resist.

Products according to the present invention include substrates which are temporarily involved in production process for semiconductors, photomasks, reticles, stencil masks, nanoimprinting templates or the like.

EXAMPLES

The present invention is hereinafter explained by referring to Examples and Comparative Examples, however, is by no means limited by the following examples. The pH values of the aqueous solutions were measured by using a hydrogen ion concentration meter with a glass electrode (pH METER F-13: manufactured by HORIBA, Ltd.).

[Water-Soluble Polymer]

Poly(5-sulfoisothianaphthene-1,3-diyl):

Poly(5-sulfoisothianaphthene-1,3-diyl) was synthesized and purified according to the method described in JP-A-H7-48436. According to the ratio of substitution of polymer repeating units by sulfonic acid groups calculated through neutralizing titration using alkali, the water-soluble polymer was confirmed to be a polymer having the sulfonic acid substitution composition of almost 100 mol % (mol fraction:1.0). The number average molecular weight of the polymer was 18,000 as measured by GPC measurement (in terms of sodium polystyrene sulfonate). The obtained poly(5-sulfoisothianaphthene-1,3-diyl) was adjusted to be a 0.1 wt % aqueous solution and then concentrated to have a concentration of 1 wt % by using Pellicon XL 50 (membrane type: Biomax-10) manufactured by Millipore Corporation. This procedure was repeated 5 times for purification.

Poly(3-(3-thienyl)) propanesulfonic acid:

Poly(3-(3-thienyl)) propanesulfonic acid was synthesized according to the method described in Polymer Preprints Japan, vol. 39, page 561(1990), published by Society of Polymer Science, Japan for its 39$^{th}$ annual meeting. The weight-average molecular weight was 100,000 as measured by GPC measurement (in terms of pullulan). The obtained poly(3-(3-thienyl)) propanesulfonic acid was adjusted to be a 0.1 wt % aqueous solution and then concentrated to have a concentration of 1 wt % by using Pellicon XL 50 (membrane type: Biomax-10) manufactured by Millipore Corporation. This procedure was repeated 5 times for purification.

Poly(aniline-3-sulfonic acid):

Poly(aniline-3-sulfonic acid) was synthesized according to the method described in J. Am. Chem. Soc., 112, page 2800 (1990). The weight-average molecular weight was 20,000 as measured by GPC measurement (in terms of pullulan). The obtained poly(aniline-3-sulfonic acid) was adjusted to be a 0.1 wt % aqueous solution and then concentrated to have a concentration of 1 wt % by using Pellicon XL 50 (membrane type: Biomax-10) manufactured by Millipore Corporation. This procedure was repeated 5 times for purification.

Water-Soluble Polymer Having a Polypeptide Structure:

Hydrolyzed collagen (additive A):Promois W-42SP(Mn: 1000)

Hydrolyzed collagen (additive B):Promois W-32(Mn:400)

Hydrolyzed collagen (additive C):Promois W-52P(Mn: 2000)

Hydrolyzed keratin (additive D):Promois WK-H(Mn: 1000)

Hydrolyzed keratin (additive E):Promois WK-L(Mn: 4000)

Hydrolyzed silk (additive F):Promois SILK-700SP(Mn: 350)

Hydrolyzed silk (additive G):Promois SILK-1000P(Mn: 1000)

The molecular weights of the additives are shown by the number average molecular weight (Mn). The molecular weights of additives A to F were calculated based on the total nitrogen amount and amino acid nitrogen amount and the molecular weight of additive G was calculated by gel filtration analysis. All the above water-soluble polymers having a polypeptide structure are products of SEIWA SUPPLY CO., LTD.

[Water-Soluble Polymer Having a Polyvinyl Structure as Repeating Unit]

polyvinylmethylether (additive H): 50% aqueous solution of poly(methylvinylether) manufactured by Sigma-Aldrich Corp.

polyvinylpyrroridone (additive I): manufactured by Sigma-Aldrich Corp. (Mw 1,300,000)

vinylpyrrolidone/vinylcaprolactam copolymer (additive J): LuvitecVPC55K65W manufactured by BASF Aktiengesellschaft polyvinyl caprolactam (additive K): prepared by purifying Luvicap EG (manufactured by BASF Aktiengesellschaft) with an ultrafiltration membrane polyvinylpyrrolidone (additive L): manufactured by Sigma-Aldrich Corp. (Mw 55,000)

polystyrene sulfonic acid ammonium salt (additive M): manufactured by Sigma-Aldrich Corp. (Mw 200,000)

polyacrylamide (additive N): manufactured by Sigma-Aldrich Corp. (Mw 10,000)

polyacrylic acid (additive O): manufactured by Sigma-Aldrich Corp. (Mw 250,000)

In the purification with an ultrafiltration membrane, Pellicon XL 50 (membrane type: Biomax-5) manufactured by Millipore Corporation was used and dilution/concentration process was repeated through Luvitec EG manufactured by BASF Aktiengesellschaft to remove solvent other than purified water.

Surfactant:

Dodecylbenzene sulfonic acid (additive P): PELEX FS produced by KAO Corporation

Alkyl diphenylether disulfonic acid (additive Q): Prepared by removing sodium from PELEX SSH produced by KAO Corporation (sodium alkyldiphenylether disulfonate) with a cationic ion exchange resin (Amberlite IR-120B produced by ORGANO Corporation)

Example 1

0.6 mass parts of poly(5-sulfo isothianaphthene-1,3-diyl) and 0.2 mass parts of hydrolyzed collagen (additive A) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A), development time of negative-type chemically amplified resist (measurement condition B) and surface resistance of the antistatic agent (measurement condition F) were measured by the following method. The results are shown in Table 1.

Example 2

0.6 mass parts of poly(5-sulfo isothianaphthene-1,3-diyl), 0.025 mass parts of dodecylbenzene sulfonic acid (additive P) and 0.1 mass parts of hydrolyzed collagen (additive A) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A), development time of negative-type chemically amplified resist (measurement condition B) and surface resistance of the antistatic agent (measurement condition F) were measured by the following method. The results are shown in Table 1.

Example 3

0.6 mass parts of poly(5-sulfo isothianaphthene-1,3-diyl), 0.025 mass parts of dodecylbenzene sulfonic acid (additive P) and 0.2 mass parts of hydrolyzed collagen (additive A) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A), development time of negative-type chemically amplified resist (measurement conditions B and B-2) and surface resistance of the antistatic agent (measurement condition F) were measured by the following method. The results are shown in Tables 1 and 2.

Example 4

0.6 mass parts of poly(5-sulfo isothianaphthene-1,3-diyl), 0.05 mass parts of alkyl diphenylether disulfonic acid (additive Q) and 0.1 mass parts of hydrolyzed collagen (additive A) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A), development time of negative-type chemically amplified resist (measurement condition B) and surface resistance of the antistatic agent (measurement condition F) were measured by the following method. The results are shown in Table 1.

Example 5

0.6 mass parts of poly(5-sulfo isothianaphthene-1,3-diyl), 0.05 mass parts of alkyl diphenylether disulfonic acid (additive Q) and 0.2 mass parts of hydrolyzed collagen (additive A) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A), the contact angle against positive-type chemically amplified resist (contact angle measurement B), development time of negative-type chemically amplified resist (measurement condition B), film-thinning of positive-type chemically amplified resist (measurement condition E) and surface resistance of the antistatic agent (measurement condition F) were measured by the following method. The results are shown in Tables 1 and 7.

Example 6

0.6 mass parts of poly(5-sulfo isothianaphthene-1,3-diyl), 0.025 mass parts of dodecylbenzene sulfonic acid (additive P) and 0.2 mass parts of hydrolyzed collagen (additive B) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A), development time of negative-type chemically amplified resist (measurement condition B-2) and surface resistance of the antistatic agent (measurement condition F) were measured by the following method. The results are shown in Table 2.

Example 7

0.6 mass parts of poly(5-sulfo isothianaphthene-1,3-diyl), 0.025 mass parts of dodecylbenzene sulfonic acid (additive P) and 0.2 mass parts of hydrolyzed collagen (additive C) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A), development time of negative-type chemically amplified resist (measurement condition B-2) and surface resistance of the antistatic agent (measurement condition F) were measured by the following method. The results are shown in Table 2.

Example 8

0.6 mass parts of poly(5-sulfo isothianaphthene-1,3-diyl), 0.025 mass parts of dodecylbenzene sulfonic acid (additive P)

and 0.2 mass parts of hydrolyzed keratin (additive D) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A), development time of negative-type chemically amplified resist (measurement condition B-2) and surface resistance of the antistatic agent (measurement condition F) were measured by the following method. The results are shown in Table 2.

Example 9

0.6 mass parts of poly(5-sulfo isothianaphthene-1,3-diyl), 0.025 mass parts of dodecylbenzene sulfonic acid (additive P) and 0.2 mass parts of hydrolyzed keratin (additive E) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A), development time of negative-type chemically amplified resist (measurement condition B-2) and surface resistance of the antistatic agent (measurement condition F) were measured by the following method. The results are shown in Table 2.

Example 10

0.6 mass parts of poly(5-sulfo isothianaphthene-1,3-diyl), 0.025 mass parts of dodecylbenzene sulfonic acid (additive P) and 0.2 mass parts of hydrolyzed silk (additive F) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A), development time of negative-type chemically amplified resist (measurement condition B-2) and surface resistance of the antistatic agent (measurement condition F) were measured by the following method. The results are shown in Table 2.

Example 11

0.6 mass parts of poly(5-sulfo isothianaphthene-1,3-diyl), 0.025 mass parts of dodecylbenzene sulfonic acid (additive P) and 0.2 mass parts of hydrolyzed silk (additive G) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A), development time of negative-type chemically amplified resist (measurement condition B-2) and surface resistance of the antistatic agent (measurement condition F) were measured by the following method. The results are shown in Table 2.

Example 12

0.6 mass parts of poly(5-sulfo isothianaphthene-1,3-diyl) and 0.2 mass parts of polyvinylmethylether (additive H) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A), development time of negative-type chemically amplified resist (measurement condition B) and surface resistance of the antistatic agent (measurement condition F) were measured by the following method. The results are shown in Table 3.

Examples 13 to 24

Antistatic agents were prepared by using water-soluble polymers having a polyvinyl structure as repeating unit (additives H to K) and surfactants (additives P and Q) as shown in Table 3, in the same manner as in Example 12.

By using each of the obtained antistatic agent, the contact angle against negative-type chemically amplified resist (contact angle measurement A), development time of negative-type chemically amplified resist (measurement condition C) and surface resistance of the antistatic agent (measurement condition F) were measured by the following method. The results are shown in Table 3.

Example 25

0.6 mass parts of poly(3-(3-thienyl)) propanesulfonic acid, 0.025 mass parts of dodecylbenzene sulfonic acid (additive P) and 0.2 mass parts of hydrolyzed collagen (additive A) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A) and development time of negative-type chemically amplified resist (measurement condition B-2) were measured by the following method. The results are shown in Table 4.

Example 26

0.6 mass parts of sulfonated polyaniline, 0.025 mass parts of dodecylbenzene sulfonic acid (additive P) and 0.2 mass parts of hydrolyzed collagen (additive A) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A) and development time of negative-type chemically amplified resist (measurement condition B-2) were measured by the following method. The results are shown in Table 4.

Example 27

0.6 mass parts of poly(5-sulfo isothianaphthene-1,3-diyl), 0.05 mass parts of dodecylbenzene sulfonic acid (additive P) and 0.2 mass parts of hydrolyzed collagen (additive A) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A-2), development time of negative-type chemically amplified resist (measurement condition C) and surface resistance of the antistatic agent (measurement condition F) were measured by the following method. The results are shown in Table 5.

Example 28

0.6 mass parts of poly(5-sulfo isothianaphthene-1,3-diyl), 0.05 mass parts of dodecylbenzene sulfonic acid (additive P) and 0.2 mass parts of polyvinylmethylether (additive H) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A-2), development time of negative-type chemically amplified resist (measurement condition C) and surface resistance of the antistatic agent (measurement condition F) were measured by the following method. The results are shown in Table 5.

Example 29

0.6 mass parts of poly(5-sulfo isothianaphthene-1,3-diyl), 0.1 mass parts of dodecylbenzene sulfonic acid (additive P) and 0.2 mass parts of hydrolyzed collagen (additive A) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type non-chemically amplified resist (contact angle measurement A-3) and development time of negative-type non-chemically amplified resist (measurement condition D) were measured by the following method. The results are shown in Table 6.

Example 30

0.6 mass parts of poly(5-sulfo isothianaphthene-1,3-diyl), 0.1 mass parts of dodecylbenzene sulfonic acid (additive P) and 0.2 mass parts of polyvinylmethylether (additive H) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type non-chemically amplified resist (contact angle measurement A-3) and development time of negative-type non-chemically amplified resist (measurement condition D) were measured by the following method. The results are shown in Table 6.

Comparative Example 1

0.6 mass parts of poly(5-sulfo isothianaphthene-1,3-diyl) was dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A), development time of negative-type chemically amplified resist (measurement condition B) and surface resistance of the antistatic agent (measurement condition F) were measured by the same method as in Example 1. The results are shown in Table 1.

Comparative Example 2

0.6 mass parts of poly(5-sulfo isothianaphthene-1,3-diyl) and 0.025 mass parts of dodecylbenzene sulfonic acid (additive P) were dissolved in water to thereby make the total amount 80 mass parts. By adding ammonia water thereto, the pH was adjusted to 4.5 and then water was further added thereto to thereby prepare an antistatic agent of the total amount 100 mass parts. By using the obtained antistatic agent, the contact angle against negative-type chemically amplified resist (contact angle measurement A), development time of negative-type chemically amplified resist (measurement conditions B and B-2) and surface resistance of the antistatic agent (measurement condition F) were measured by the same method as in Example 1. The results are shown in Tables 1 and 2.

Comparative Example 3

0.6 mass parts of poly(5-sulfo isothianaphthene-1,3-diyl) and 0.050 mass parts of alkyl diphenylether disulfonic acid (additive Q) were dissolved in water to thereby make the total amount 80 mass parts. By adding ammonia water thereto, the pH was adjusted to 4.5 and then water was further added thereto to thereby prepare an antistatic agent of the total amount 100 mass parts. By using the obtained antistatic agent, the contact angle against negative-type chemically amplified resist (contact angle measurement A), the contact angle against positive-type chemically amplified resist (contact angle measurement A-4), development time of negative-type chemically amplified resist (measurement condition B), film thinning of positive-type chemically amplified resist (measurement condition E) and surface resistance of the antistatic agent (measurement condition F) were measured by the same method as in Example 5. The results are shown in Tables 1 and 7.

Comparative Examples 4 to 7

Antistatic agents were prepared in the same manner as in Example 12 except that water-soluble polymers (additives L to O) as shown in Table 3 and surfactant (additive P) were used instead of additive H.

By using each of the obtained antistatic agent, the contact angle against negative-type chemically amplified resist (contact angle measurement A), development time of negative-type chemically amplified resist (measurement condition B) and surface resistance of the antistatic agent (measurement condition F) were measured by the following method. The results are shown in Table 3.

Comparative Example 8

0.6 mass parts of poly(3-(3-thienyl)) propanesulfonic acid and 0.025 mass parts of dodecylbenzene sulfonic acid (additive P) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A) and development time of negative-type chemically amplified resist (measurement condition B-2) were measured by the following method. The results are shown in Table 4.

Comparative Example 9

0.6 mass parts of sulfonated polyaniline and 0.025 mass parts of dodecylbenzene sulfonic acid (additive P) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A) and development time of negative-type chemically amplified resist (measurement condition B-2) were measured by the following method. The results are shown in Table 4.

Comparative Example 10

0.6 mass parts of poly(5-sulfo isothianaphthene-1,3-diyl) and 0.05 mass parts of dodecylbenzene sulfonic acid (additive P) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type chemically amplified resist (contact angle measurement A-2), development time of negative-type chemically amplified resist (measurement condition C) and surface resistance of the antistatic agent (measurement condition F) were measured by the following method. The results are shown in Table 5.

Comparative Example 11

0.6 mass parts of poly(5-sulfo isothianaphthene-1,3-diyl) and 0.1 mass parts of dodecylbenzene sulfonic acid (additive P) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type non-chemically amplified resist (contact angle measurement A-3) and development time of negative-type non-chemically amplified resist (measurement condition D) were measured by the following method. The results are shown in Table 6.

Comparative Example 12

0.6 mass parts of poly(5-sulfo isothianaphthene-1,3-diyl) was dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, the contact angle against negative-type non-chemically amplified resist (contact angle measurement A-3) and development time of nega-tive-type non-chemically amplified resist (measurement condition D) were measured by the following method. The results are shown in Table 6.

Measurement and evaluation methods for each of the properties are as follows. In the following, preparation of antistatic films and resist films by spin-coating, removing of antistatic films by using ultrapure water and shaking off the developing solution after development were performed by using Spinner 1H-III (manufactured by Kyoei Semiconductor Co., Ltd.). Further, a ditch of 1-mm width was cut in each the resist films and the antistatic films and the film thickness of each of the films was calculated based on level difference measured by using a stylus profilometer Dektak-3030 (manufactured by ULVAC Inc.).

1) Measurement on the Contact Angle Against Negative-Type Chemically Amplified Resist (Contact Angle Measurement A)

The contact angle was measured by using a contact angle meter, DM-500 (manufactured by Kyowa InterFACE Science Co., Ltd.). 30 seconds after a droplet of the antistatic agent was prepared on the resist film surface, the contact angle between the droplet and the resist film was read. The resist film had been prepared by dropping 0.2 ml of negative-type chemically amplified resist on a 4×4 cm silicon wafer, immediately spin-coating it with a spinner at 1500 rpm and conducting pre-baking at 105° C. on a hot plate for 90 seconds to thereby remove solvent. For the negative-type chemically amplified resist, Microposit SAL-601-SR2 E-beam resist (produced by Rohm and Haas Electronic Materials) was used.

1-2) Measurement on the Contact Angle Against Negative-Type Chemically Amplified Resist (Contact Angle Measurement A-2)

The contact angle was measured by using a contact angle meter, DM-500 (manufactured by Kyowa InterFACE Science Co., Ltd.). 30 seconds after a droplet of the antistatic agent was prepared on the resist film surface, the contact angle between the droplet and the resist film was read. The resist film had been prepared by dropping 0.2 ml of negative-type chemically amplified resist on a 4×4 cm silicon wafer, immediately spin-coating it with a spinner at 1500 rpm and conducting pre-baking at 105° C. on a hot plate for 90 seconds to thereby remove solvent. For the negative-type chemically amplified resist, FEN-270 resist produced by FUJIFILM Electronic Materials Co., Ltd. was used.

1-3) Measurement on the Contact Angle Against Non-Chemically Amplified Resist (Contact Angle Measurement A-3)

The contact angle was measured by using a contact angle meter, DM-500 (manufactured by Kyowa InterFACE Science Co., Ltd.). 30 seconds after a droplet of the antistatic agent was prepared on the resist film surface, the contact angle between the droplet and the resist film was read. The resist film had been prepared by dropping 0.2 ml of negative-type non-chemically amplified resist on a 4×4 cm silicon wafer, immediately spin-coating it with a spinner at 1500 rpm and conducting pre-baking at 180° C. on a hot plate for 40 minutes to thereby remove solvent. For the non-chemically amplified resist, Fox-12 produced by Dow Corning Corporation was used.

1-4) Measurement on the Contact Angle Against Positive-Type Chemically Amplified Resist (Contact Angle Measurement A-4)

The contact angle was measured by using a contact angle meter, DM-500 (manufactured by Kyowa InterFACE Science Co., Ltd.). 30 seconds after a droplet of the antistatic agent was prepared on the resist film surface, the contact angle between the droplet and the resist film was read. The resist film had been prepared by dropping 0.2 ml of positive-type chemically amplified resist on a 4×4 cm silicon wafer, immediately spin-coating it with Spinner at 1500 rpm and conducting pre-baking at 120° C. on a hot plate for 90 seconds to thereby remove solvent. For the positive-type chemically amplified resist, FEP-171 resist produced by FUJIFILM Electronic Materials Co., Ltd. was used.

2) Measurement of Developing Time of Negative-Type Chemically Amplified Resist (Measurement Condition B)

The developing time of negative-type chemically amplified resist was evaluated by the following procedures.

(1) Formation of Resist Film:

Immediately after 0.2 ml of the negative-type chemically amplified resist was dropped on a 4×4 cm silicon wafer, it was coated with Spinner at 1500 rpm and by pre-baking at 105° C. for 90 seconds, solvent was removed, to thereby obtain a resist film having a film thickness of about 300 nm. For the negative-type chemically amplified resist, Microposit SAL-601-SR2 E-beam resist produced by Rohm and Haas Electronic Materials was used.

(2) Formation of Antistatic Film:

After 10 minutes after 2 ml of the antistatic agent was dropped on the surface of the above-prepared resist film, it was coated with Spinner 1H-III (manufactured by Kyoei Semiconductor Co., Ltd.) at 800 rpm, to thereby obtain an antistatic film having a film thickness of about 20 nm.

(3) Baking treatment: the substrate having the antistatic film and the resist laminated thereon was heated on a hot plate at 80° C. for 180 seconds and left standing still in air at room temperature for 5 minutes.

(4) Removing of antistatic film: 10 ml of ultrapure water was dropped on the surface of the antistatic film after baking treatment and after leaving it standing for 60 seconds, the antistatic film dissolved in the ultrapure water was removed by using a spin-coater at 800 rpm.

(5) Rebaking treatment: After heating of post-exposure baking condition for the resist was conducted at 110° C. for 60 seconds, the substrate was left standing still in air at room temperature for 5 minutes.

(6) Development: 2 ml of 2.38 mass % tetramethylammonium hydroxide aqueous solution serving as developing solution was dropped on the surface of the resist obtained in (5) above. The time period it took the resist film contacting with the developing solution to disappear from the substrate surface was evaluated as the developing time.

2-2) Measurement of Developing Time of Negative-Type Chemically Amplified Resist (Measurement Condition B-2)

The developing time of negative-type chemically amplified resist was evaluated in the same manner as in measurement condition B except that the baking treatment (3) in 2) above was conducted at 75° C. for 60 seconds instead of heating at 80° C. for 180 seconds.

3) Measurement of Developing Time of Negative-Type Chemically Amplified Resist (Measurement Condition C)

The developing time of negative-type chemically amplified resist was evaluated by the following procedures.

(1) Formation of Resist Film:

Immediately after 0.2 ml of the negative-type chemically amplified resist was dropped on a 4×4 cm silicon wafer, it was coated with Spinner at 1000 rpm and by pre-baking at 120° C. for 90 seconds, solvent was removed, to thereby obtain a resist film having a film thickness of about 300 nm. For the negative-type chemically amplified resist, FEN-270 resist produced by FUJIFILM Electronic Materials Co., Ltd. was used.

(2) Formation of Antistatic Film:

After 10 minutes after 2 ml of the antistatic agent was dropped on the surface of the above-prepared resist film, it was coated with Spinner 1H-III (manufactured by Kyoei Semiconductor Co., Ltd.) at 800 rpm, to thereby obtain an antistatic film having a film thickness of about 20 nm.

(3) Baking treatment: The substrate having the antistatic film and the resist laminated thereon was heated on a hot plate at 80° C. for 90 seconds and left standing still in air at room temperature for 5 minutes.

(4) Rebaking treatment: After heating of post-exposure baking condition for the resist was conducted at 110° C. for 90 seconds, the substrate was left standing still in air at room temperature for 5 minutes.

(5) Removing of antistatic film: 10 ml of ultrapure water was dropped on the surface of the antistatic film after baking treatment and after leaving it standing for 60 seconds, the antistatic film dissolved in the ultrapure water was removed by using a spin-coater at 800 rpm.

(6) Development: 2 ml of 2.38 mass % tetramethylammonium hydroxide aqueous solution serving as developing solution was dropped on the surface of the resist obtained in (5) above. The time period it took the resist film contacting with the developing solution to disappear from the substrate surface was evaluated as the developing time.

4) Measurement of Developing Time of Negative-Type Nonchemically Amplified Resist (Measurement Condition D)

The developing time of negative-type non-chemically amplified resist was evaluated by the following procedures.

(1) Formation of Resist Film:

Immediately after 0.2 ml of the negative-type non-chemically amplified resist was dropped on a 4×4 cm silicon wafer, it was coated with Spinner at 1500 rpm and by pre-baking at 180° C. for 10 minutes, solvent was removed, to thereby obtain a resist film having a film thickness of about 200 nm. For the negative-type nonchemically amplified resist, Fox-12 produced by Dow Corning Corporation was used.

(2) Formation of Antistatic Film:

After 10 minutes after 2 ml of the antistatic agent was dropped on the surface of the above-prepared resist film, it was coated with Spinner 1H-III (manufactured by Kyoei Semiconductor Co., Ltd.) at 800 rpm, to thereby obtain an antistatic film having a film thickness of about 20 nm.

(3) Removing of antistatic film: 10 ml of ultrapure water was dropped on the surface of the antistatic film after baking treatment and after leaving it standing for 60 seconds, the antistatic film dissolved in the ultrapure water was removed by using a spin-coater at 800 rpm.

(4) Development: 2 ml of 2.38 mass % tetramethylammonium hydroxide aqueous solution serving as developing solution was dropped on the surface of the resist obtained in (3) above. The time period it took the resist film contacting with the developing solution to disappear from the substrate surface was evaluated as the developing time.

In a case where the step of (4) above was conducted on a resist film of (1) above without using any of antistatic agents of Examples and Comparative Examples, the development time with TMAH (tetramethylammonium hydroxide) was 60 seconds.

5) Measurement on Film Thinning of Positive-Type Chemically Amplified Resist (Measurement Condition E)

Film thinning in positive-type chemically amplified resist was evaluated by the following procedures.

(1) Formation of positive-type chemically amplified resist film: Immediately after 0.2 ml of the positive-type chemically amplified resist was dropped on a 4×4 cm silicon wafer, it was coated with Spinner at 1500 rpm and by pre-baking at 120° C. for 90 seconds, solvent was removed, to thereby obtain a resist film having a film thickness of about 300 nm. For the positive-type chemically amplified resist, FEP-171 resist produced by FUJIFILM Electronic Materials Co., Ltd. was used.

(2) Measurement on film thickness: A ditch of about 1-mm width was cut in the resist film and the level difference was measured by using a stylus profilometer and defined as the film thickness immediately after the resist film coating.

(3) Formation of antistatic film: After 1 minute after 2 ml of the antistatic agent was dropped on the surface of the above-coated resist, spin-coating was conducted with Spinner at 800 rpm, to thereby prepare an antistatic film having a film thickness of about 20 nm.

(4) Baking treatment: The substrate having the antistatic film and the resist laminated thereon was heated on a hot plate at 80° C. for 90 seconds and left standing still in air at room temperature for 5 minutes.

(5) Rebaking treatment: After heating of post-exposure baking condition for the resist was conducted at 110° C. for 60 seconds, the substrate was left standing still in air at room temperature for 5 minutes.

(6) Removing of antistatic film: 10 ml of ultrapure water was dropped on the surface of the antistatic film after baking treatment and after leaving it standing for 60 seconds, the antistatic film dissolved in the ultrapure water was removed by using a spin-coater at 800 rpm.

(7) Development: 2 ml of 2.38 mass % tetramethylammonium hydroxide aqueous solution serving as developing solution was dropped on the surface of the resist from which the antistatic film had been removed. After left standing still at room temperature for 60 seconds, the developing solution was spun off by using a spin-coater at 200 rpm while dropping 10 ml of ultrapurewater onto the surface. Further, water droplets remaining on the resist surface were spun off at 800 rpm.

(8) Remeasurement of film thickness: After development, film thickness of the resist was evaluated again by measuring the ditch of about 1-mm width by using a stylus profilometer and was defined as the resist film thickness after development.

(9) Measurement on film-thinning value: The value obtained by subtracting the film thickness value of above (8) from the film thickness value of above (2) was defined as film-thinning value of the resist.

6) Measurement on Surface Resistance of Antistatic Film (Measurement Condition F)

After dropping 2 ml of the antistatic agent on a 60×60 mm square glass substrate (#1737 produced by Corning Incorporated), it was spin-coated with Spinner at 800 rpm to thereby prepare a coating film consisting of the antistatic agent on the substrate. The surface resistance of the obtained coating film of the antistatic agent was measured by using a surface resistance measuring apparatus, Megaresta Model HT-301 (produced by SHISHIDO ELECTROSTATIC., LTD.).

TABLE 1

|  | Additive A (ppm) | Additive P (ppm) | Additive Q (ppm) | Contact Angle Measurement A (°) | Developing time (Seconds) Measurement Condition B | Surface Resistance ($\Omega$/sq) Measurement Condition F |
| --- | --- | --- | --- | --- | --- | --- |
| Example 1 | 2000 | — | — | 70.1 | 54 | $3 \times 10^6$ |
| Example 2 | 1000 | 250 | — | 29.2 | 235 | $2 \times 10^6$ |
| Example 3 | 2000 | 250 | — | 30.4 | 129 | $3 \times 10^6$ |
| Example 4 | 1000 | — | 500 | 28.2 | 154 | $2 \times 10^6$ |
| Example 5 | 2000 | — | 500 | 27.3 | 88 | $3 \times 10^6$ |
| Comparative Example 1 | — | — | — | 67.2 | 153 | $1 \times 10^6$ |
| Comparative Example 2 | — | 250 | — | 34.1 | >300 | $1 \times 10^6$ |
| Comparative Example 3 | — | — | 500 | 30.9 | >300 | $1 \times 10^6$ |

In Example 1, by addition of water-soluble polymer having a polypeptide structure, development time can be shorter than Comparative Example 1. In Examples 2 to 5, by using surfactants, contact angles are lowered to thereby achieve good coatability and further by adding water-soluble polymer having a polypeptide structure, development time of the negative-type chemically amplified resists can be shortened. In Comparative Example 1, with the contact angle being large, coating defects were generated in spin coating. In Comparative Examples 2 and 3, the contact angle could be reduced with addition of surfactants and coatability was good enough to avoid generation of coating defects. However, since the negative-type chemically amplified resist was not dissolved by the developing solution, development defects were caused.

TABLE 2

|  | Additive type | Addition amount (ppm) | Additive P (ppm) | Contact Angle (°) Measurement A | Developing time (Seconds) Measurement Condition B-2 | Surface Resistance ($\Omega$/sq) Measurement Condition F |
| --- | --- | --- | --- | --- | --- | --- |
| Comparative Example 2 | — | — | 250 | 34.1 | 286 | $1 \times 10^6$ |
| Example 3 | Additive A | 2000 | 250 | 30.4 | 73 | $3 \times 10^6$ |
| Example 6 | Additive B | 2000 | 250 | 26.4 | 88 | $3 \times 10^6$ |
| Example 7 | Additive C | 2000 | 250 | 30.9 | 81 | $3 \times 10^6$ |
| Example 8 | Additive D | 2000 | 250 | 25.4 | 112 | $3 \times 10^6$ |

TABLE 2-continued

|  | Additive type | Addition amount (ppm) | Additive P (ppm) | Contact Angle (°) Measurement A | Developing time (Seconds) Measurement Condition B-2 | Surface Resistance (Ω/sq) Measurement Condition F |
|---|---|---|---|---|---|---|
| Example 9 | Additive E | 2000 | 250 | 39.0 | 94 | $3 \times 10^6$ |
| Example 10 | Additive F | 2000 | 250 | 30.5 | 110 | $3 \times 10^6$ |
| Example 11 | Additive G | 2000 | 250 | 29.3 | 81 | $3 \times 10^6$ |

Regardless of the molecular weight of the water-soluble polymer having a polypeptide structure used in Example 1 and the type of protein material which the polymer is derived from, the contact angle can be reduced by using surfactant and good coatability can be imparted, and moreover, development time of the negative-type chemically amplified resist can be shortened.

Additive H: polyvinylmethylether
Additive I: polyvinylpyrrolidone (Mw 1,300,000)
Additive J: polyvinylpyrrolidone vinylcaprolactam copolymer
Additive K: polyvinyl caprolactam
Additive L: polyvinylpyrrolidone (Mw 55,000)
Additive M: polystyrene sulfonic acid $NH_3$(Mw 200,000)

TABLE 3

|  | Additive Type | Addition Amount (ppm) | Additive P(ppm) | Additive Q(ppm) | Contact Angle Measurement A (°) | Development Time (sec) Measurement Condition B | Surface Resistance (Ω/sq) Measurement Condition F |
|---|---|---|---|---|---|---|---|
| Example 12 | H | 2000 | — | — | 68.2 | 95 | $8 \times 10^6$ |
| Example 13 | I | 2000 | — | — | 71.4 | 88 | $5 \times 10^7$ |
| Example 14 | J | 2000 | — | — | 74.7 | 73 | $2 \times 10^6$ |
| Example 15 | H | 1000 | 250 | — | 26.1 | 239 | $2 \times 10^6$ |
| Example 16 | H | 2000 | 250 | — | 33.1 | 129 | $6 \times 10^6$ |
| Example 17 | H | 2000 | — | 500 | 23 | 118 | $4 \times 10^6$ |
| Example 18 | I | 1000 | 250 | — | 26.6 | 189 | $1 \times 10^6$ |
| Example 19 | I | 2000 | 250 | — | 28.6 | 184 | $5 \times 10^6$ |
| Example 20 | J | 1000 | 250 | — | 29 | 210 | $2 \times 10^6$ |

TABLE 3

|  | Additive Type | Addition Amount (ppm) | Additive P(ppm) | Additive Q(ppm) | Contact Angle Measurement A (°) | Development Time (sec) Measurement Condition B | Surface Resistance (Ω/sq) Measurement Condition F |
|---|---|---|---|---|---|---|---|
| Example 21 | J | 2000 | 250 | — | 29.4 | 158 | $5 \times 10^6$ |
| Example 22 | J | 2000 | — | 750 | 32.1 | 117 | $1 \times 10^7$ |
| Example 23 | K | 2000 | 250 | — | 28.8 | 215 | $1 \times 10^7$ |
| Example 24 | K | 3000 | 250 | — | 29.7 | 126 | $8 \times 10^7$ |
| Comparative Example 4 | L | 1000 | 250 | — | 29 | >300 | $1 \times 10^6$ |
| Comp. Example 5 | M | 1000 | 250 | — | 25.8 | >300 | $9 \times 10^5$ |
| Comp. Example 6 | N | 1000 | 250 | — | 27.8 | >300 | $2 \times 10^6$ |
| Comp. Example 7 | O | 1000 | 250 | — | 27.1 | >300 | $3 \times 10^6$ |

Additive N: polyacrylamide (Mw 10,000)
Additive O: polyacrylic acid (Mw 250,000)

In Examples 12 to 14, by addition of specific water-soluble polymer having a polyvinyl structure as repeating unit, development time of negative type chemically amplified resist can be shortened.

In Examples 15 to 24, by using surfactants, contact angles are lowered to thereby achieve good coatability and further by adding specific water-soluble polymer having a polyvinyl structure as repeating unit, development time of the negative-type chemically amplified resists can be shortened.

In Comparative Examples 4 to 7, with the contact angle being reduced by addition of surfactant and water-soluble polymer, coatability was good enough to avoid generation of coating defects. However, since the negative-type chemically amplified resist was not dissolved in the developing solution, development defects were caused.

TABLE 4

|  | Electro-conductive Polymer | Additive A (ppm) | Additive P (ppm) | Contact Angle Measurement A (°) | Development Time (Sec) Measurement Condition B-2 |
|---|---|---|---|---|---|
| Example 25 | poly(3-(3-thienyl))propanesulfonic acid | 2000 | 250 | 38 | 80 |
| Example 26 | Sulfonated polyaniline | 2000 | 250 | 18.7 | 286 |
| Comparative Example 8 | poly(3-(3-thienyl))propanesulfonic acid | — | 250 | 41.6 | >300 |
| Comparative Example 9 | Sulfonated polyaniline | — | 250 | 19.3 | >300 |

In Examples 25 and 26, by addition of water-soluble polymer having a polypeptide structure (additive A), development time of the negative-type chemically amplified resists can be shortened. Not only in case of using poly(5-sulfo isothianaphthene-1,3-diyl) but also in case of using poly(3-(3-thienyl)) propanesulfonic acid or sulfonated polyaniline, antistatic agent containing such a water-soluble polymer having a polypeptide structure or containing such a specific water-soluble polymer having a polyvinyl structure as repeating unit does not easily cause resist mixing. In Comparative Examples 8 and 9, the antistatic agents, containing surfactant P, could be applied onto the resist substrate, however since the negative-type chemically amplified resist was not dissolved in the developing solution, development defects were caused.

TABLE 5

|  | Additive Type | Added amount (ppm) | Additive P (ppm) | Contact Angle Measurement A-2 (°) | Development Time (Sec) Measurement Condition C |
|---|---|---|---|---|---|
| Example 27 | A | 2000 | 500 | 24.7 | 87 |
| Example 28 | H | 2000 | 500 | 25.9 | 70 |
| Comp. Example 10 | — | — | 500 | 24.7 | 116 |

TABLE 6

|  | Additive Type | Added Amount (ppm) | Additive P (ppm) | Contact Angle Measurement A-3 (°) | Development Time (Sec) Measurement Condition D |
|---|---|---|---|---|---|
| Example 29 | A | 2000 | 1000 | 47 | 59 |
| Example 30 | H | 2000 | 1000 | 49 | 61 |
| Comp. Example 11 | — | — | 1000 | 46 | 53 |
| Comp. Example 12 | — | — | — | 79 | — |

The development time of negative-type non-chemically-amplified resist Fox-12 with TMAH in Examples 29 and 30 each using an antistatic agent containing a water-soluble polymer having a polypeptide structure or containing such a specific water-soluble polymer having a polyvinyl structure as repeating unit is almost the same with the development time with TMAH in case of not using antistatic agent while the development time with TMAH in Comparative Example 11 is shorter. That means that an antistatic agent containing a water-soluble polymer having a polypeptide structure or containing such a specific water-soluble polymer having a polyvinyl structure as repeating unit suppresses resist mixing.

In Example 12 not containing surfactant, the contact angle against Fox-12 was as high as 79°, and the agent could not be applied onto Fox-12. Resist such as Fox-12 which is difficult to coat requires surfactant. In order to prevent the resist from mixing, use of an antistatic agent containing a water-soluble polymer having a polypeptide structure or containing such a specific water-soluble polymer having a polyvinyl structure as repeating unit is necessary.

TABLE 7

|  | Aditive A (ppm) | Aditive Q (ppm) | Resist film thinning (nm) Measurement Condition E | Contact Angle Measurement A-4 (°) |
|---|---|---|---|---|
| Example 5 | 2000 | 500 | 16 | 34.6 |
| Comparative Example 3 | — | 500 | 20 | 38.0 |

In the positive-type chemically amplified resist, antistatic treatment affects the resist, causing film thinning. In a case where the antistatic agent of Comparative Example 3 was used, film thinning of 20 nm was observed while in a case where the antistatic agent of Example 5 to which water-soluble polymer having a polypeptide structure had been added was used, the film thinning value was reduced to 16 nm. That is, in the positive-type chemically amplified resist, the antistatic agent of the present invention can suppress influence of surfactant on the resist with the reduced contact angle.

Example 31

0.6 mass parts of poly(5-sulfo isothianaphthene-1,3-diyl), 0.075 mass parts of alkyl diphenylether disulfonic acid (additive Q) and 0.2 mass parts of hydrolyzed collagen (additive A) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, electron beam lithography was conducted and resist-pattern formation was evaluated by the following method.

The evaluation method of resist-pattern formation by electron beam lithography is as follows.

(1) Formation of resist film: 0.2 ml of the negative-type chemically amplified resist was dropped on a 2×2 cm silicon wafer, it was coated with Spinner at 2000 rpm for 60 seconds. Then pre-baking was conducted at 105° C. for 60 seconds to remove solvent and cooled in the air at room temperature for 5 minutes, to thereby obtain a resist film having a film thickness of about 300 nm. For the negative-type chemically amplified resist, Microposit SAL-601-SR2 E-beam resist (produced by Rohm and Haas Electronic Materials) was used.

(2) After 10 minutes after 2 ml of the antistatic agent was dropped on the surface of the above-prepared resist film, it was coated with Spinner at 1500 rpm, to thereby obtain an antistatic film having a film thickness of about 20 nm.

(3) Baking treatment: The substrate having the antistatic film and the resist laminated thereon was heated on a hot plate at 75° C. for 180 seconds and left standing still in air at room temperature for 10 minutes.

(4) Electron beam lithography: Electron beam lithography was performed by using JBX-6000FS manufactured by JEOL, Ltd. The conditions for exposure to electron beam radiation were the current amount of 100 pA and the dose of 5 to 52.5 µC/cm², fine lines for line-and-space patterning (L/S) was drawn. For L/S, a design was arranged so that the lines and the spaces had the same width, with the length of 50 µm and the pitches of 200 nm, 500 nm and 1000 nm.

(5) Removing of Antistatic Film:

The surface of the antistatic film after baking treatment was left in pure water for 30 seconds and taken out and then by drying it with nitrogen gas, the antistatic film was removed.

(6) Re-baking treatment: After heating of post-exposure baking condition for the resist was conducted at 115° C. for 60 seconds, the substrate was left standing still in the air at room temperature for 5 minutes.

(7) Development: The resist substrate obtained in (6) above was immersed in 2.38 mass % tetramethylammonium hydroxide aqueous solution serving as developing solution to develop the resist and further, the substrate was rinsed by immersing it in pure water for 30 seconds.

(8) The resist-pattern was observed by an SEM to evaluate resist-pattern formation by electron beam lithography.

Comparative Example 13

0.6 mass parts of poly(5-sulfo isothianaphthene-1,3-diyl) and 0.075 mass parts of alkyl diphenylether disulfonic acid (additive Q) were dissolved in water to thereby make the total amount 80 mass parts. By adding ammonia water thereto, the pH was adjusted to 4.5 and then water was further added thereto to thereby prepare an antistatic agent of the total amount 100 mass parts.

By using the obtained antistatic agent, electron beam lithography was conducted and resist-pattern formation was evaluated by the same method as in Example 31.

As a result, in a case where the antistatic agent of Comparative Example 13 was used, many portions where the resist had remained were observed in top-view observation with optical microscope, other than the portions to which electron beam had been irradiated. In portions where the L/S pattern was formed, no space portion was observed and thus the resist pattern as desired could not be obtained. On the other hand, in a case where the antistatic agent of Example 31 was used, the L/S resist pattern as desired could be obtained. Moreover, the optimal dose determined through observation of a sectional view of the resist with SEM was a range of 10 to 14 µC/cm² at 250 µmL/S.

What is claimed is:

1. An antistatic agent, comprising a water-soluble electroconductive polymer, a solvent and a water-soluble polymer,
    wherein the water-soluble polymer is a water-soluble polymer having a polypeptide structure, said water-soluble polymer having the polypeptide structure consisting of a protein hydrolysate having a number average molecular weight of 4000 or less,
    wherein the water-soluble electroconductive polymer is a π-conjugated conductive polymer having a Bronsted acid group or a salt thereof, and
    wherein the Bronsted acid group is a sulfonic acid group.

2. The antistatic agent as claimed in claim 1, wherein the protein hydrolysate has an amino acid residue (10) a as repeating unit structure:

$$-(N(-R')-CH(-R)-C(=O))- \quad (10)a$$

wherein R and R' each independently represents a substituent constituting an amino acid residue and when R' is a hydrogen atom, R independently represents a substituent constituting an amino acid residue and when R' is not a hydrogen atom, R and R' jointly form a nitrogen-containing ring which may be substituted with a hydroxyl group.

3. The antistatic agent as claimed in claim 1, further comprising a surfactant.

4. The antistatic agent as claimed in claim 1, wherein the amount of the water-soluble electroconductive polymer is from 0.1 to 20 mass %, the amount of the water-soluble polymer having the polypeptide structure is 0.0001 to 10 mass % and the amount of the solvent is from 70.0 to 99.8 mass %.

5. The antistatic agent as claimed in claim 1, wherein the amount of the water-soluble electroconductive polymer is from 0.1 to 20 mass %, the amount of the water-soluble polymer having a polyvinyl structure is 0.0001 to 10 mass % and the amount of the solvent is from 70.0 to 99.8 mass %.

6. The antistatic agent as claimed in claim 3, wherein the amount of the water-soluble electroconductive polymer is from 0.1 to 20 mass %, the amount of the water-soluble polymer having the polypeptide structure is 0.0001 to 10 mass %, the amount of the surfactant is from 0.0001 to 2 mass % and the amount of the solvent is from 68.0 to 99.8 mass %.

7. The antistatic agent as claimed in claim 3, wherein the amount of the water-soluble electroconductive polymer is from 0.1 to 20 mass %, the amount of the water-soluble polymer having a polyvinyl structure is 0.0001 to 10 mass %, the amount of the surfactant is from 0.0001 to 2 mass % and the amount of the solvent is from 68.0 to 99.8 mass %.

8. The antistatic agent as claimed in claim 1, wherein the water-soluble electroconductive polymer includes a chemical structure represented by formula (1):

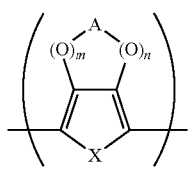

(1)

in the formula, m and n each independently represents 0 or 1, X represents any one of S, N—$R^1$ and O, ($R^1$ represents a group selected from the group consisting of a hydrogen atom, a linear or branched, saturated or unsaturated hydrocarbon group having 1 to 20 carbon atoms, a phenyl group and a substituted phenyl group and O, A represents an alkylene or alkenylene group wherein two or more double bonds may be present, having 1 to 4 carbon atoms which has at least one substituent represented by —B—$SO_3^-M^+$ and may have other substituents, B represents —$(CH_2)_p$—$(O)_q$—$(CH_2)_r$—, p and r each independently represents 0 or an integer of 1 to 3, q represents 0 or 1, and $M^+$ represents a hydrogen ion, an alkali metal ion or a quaternary ammonium ion.

9. The antistatic agent as claimed in claim 1, wherein the water-soluble electroconductive polymer includes a chemical structure represented by formula (2):

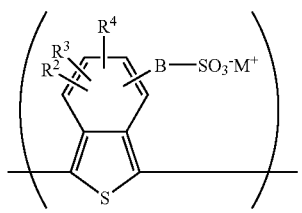

(2)

in the formula, $R^2$ to $R^4$ each independently represents a hydrogen atom, a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group, a substituted phenyl group or —B—$SO_3^-M^+$ group, B represents —$(CH_2)_p$—$(O)_q$—$(CH_2)_r$—, p and r each independently represents 0 or an integer of 1 to 3, q represents 0 or 1, and $M^+$ represents a hydrogen ion, an alkali metal ion or a quaternary ammonium ion.

10. The antistatic agent as claimed in claim 1, wherein the water-soluble electro conductive polymer includes a chemical structure represented by formula (3):

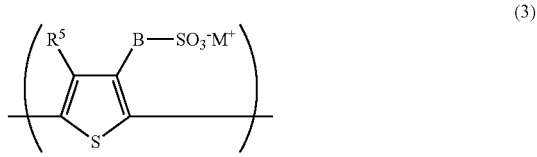

(3)

in the formula, $R^5$ represents a hydrogen atom, a linear or branched, saturated or unsaturated hydrocarbon group having 1 to 20 carbon atoms, a linear or branched, saturated or unsaturated alloy group having 1 to 20 carbon atoms, a hydroxyl group, a halogen atom, a nitro group, a cyano group, a trihalomethyl group, a phenyl group, a substituted phenyl group or —B—$SO_3^-M^+$ group, B represents —$(CH_2)_p$—$(O)_q$—$(CH_2)_r$—, p and r each independently represents 0 or an integer of 1 to 3, q represents 0 or 1, and $M^+$ represents a hydrogen ion, an alkali metal ion or a quaternary ammonium ion.

11. The antistatic agent as claimed in claim 1, wherein the water-soluble electroconductive polymer includes a chemical structure represented by formula (4):

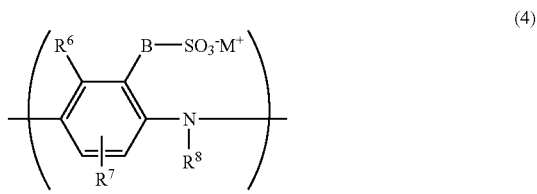

(4)

in the formula, $R^6$ and $R^7$ each independently represents a hydrogen atom, a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group, a substituted phenyl group or a —B—$SO_3^-M^+$ group, $R^8$ represents a monovalent group selected from a hydrogen atom, a linear or branched, saturated or unsaturated hydrocarbon group having 1 to 20 carbon atoms, phenyl group and a substituted phenyl group, B represents —$(CH_2)_p$—$(O)_q$—$(CH_2)_r$—, p and r each independently represents 0 or an integer of 1 to 3, q represents 0 or 1, and $M^+$ represents a hydrogen ion, an alkali metal ion or a quaternary ammonium ion.

12. The antistatic agent as claimed in claim 9, wherein the water-soluble electroconductive polymer is a polymer having 5-sulfoisothianaphthene-1,3-diyl.

\* \* \* \* \*